US011267012B2

(12) United States Patent
McGraw et al.

(10) Patent No.: US 11,267,012 B2
(45) Date of Patent: Mar. 8, 2022

(54) SPATIAL CONTROL OF VAPOR CONDENSATION USING CONVECTION

(71) Applicant: Universal Display Corporation, Ewing, NJ (US)

(72) Inventors: Gregory McGraw, Yardley, PA (US); William E. Quinn, Whitehouse Station, NJ (US); Matthew King, Evesham, NJ (US); Elliot H. Hartford, Jr., Morristown, NJ (US); Siddharth Harikrishna Mohan, Plainsboro, NJ (US)

(73) Assignee: Universal Display Corporation, Ewing, NJ (US)

( * ) Notice: Subject to any disclaimer, the term of this patent is extended or adjusted under 35 U.S.C. 154(b) by 303 days.

(21) Appl. No.: 14/643,887

(22) Filed: Mar. 10, 2015

(65) Prior Publication Data
US 2015/0376787 A1 Dec. 31, 2015

Related U.S. Application Data

(60) Provisional application No. 62/016,709, filed on Jun. 25, 2014, provisional application No. 62/061,899, filed on Oct. 9, 2014.

(51) Int. Cl.
*B05B 12/18* (2018.01)
*C23C 14/22* (2006.01)
(Continued)

(52) U.S. Cl.
CPC .............. *B05B 12/18* (2018.02); *C23C 14/04* (2013.01); *C23C 14/12* (2013.01); *C23C 14/228* (2013.01)

(58) Field of Classification Search
None
See application file for complete search history.

(56) References Cited

U.S. PATENT DOCUMENTS 4,413,022 A * 11/1983 Suntola ................. C23C 16/306
117/89
4,769,292 A 9/1988 Tang et al.
(Continued)

FOREIGN PATENT DOCUMENTS

CN 1366333 8/2002
JP 2009124061 6/2009
(Continued)

OTHER PUBLICATIONS

Brochure NP-E10-5B. "Temperature Control Equipment." SMC Corporation of America. 2011. pp. 1-8.*
(Continued)

*Primary Examiner* — Jeffrie R Lund
*Assistant Examiner* — Stanislav Antolin
(74) *Attorney, Agent, or Firm* — Butzel Long

(57) ABSTRACT

Embodiments of the disclosed subject matter provide a device including a nozzle, a source of material to be deposited on a substrate in fluid communication with the nozzle, a delivery gas source in fluid communication with the source of material to be deposited with the nozzle, an exhaust channel disposed adjacent to the nozzle, and a confinement gas source in fluid communication with the nozzle and the exhaust channel, and disposed adjacent to the exhaust channel.

26 Claims, 23 Drawing Sheets

(51) Int. Cl.
*C23C 14/04* (2006.01)
*C23C 14/12* (2006.01)

(56) References Cited

U.S. PATENT DOCUMENTS

| | | | |
|---|---|---|---|
| 5,247,190 A | 9/1993 | Friend et al. | |
| 5,421,895 A | 6/1995 | Tsubouchi | |
| 5,439,525 A | 8/1995 | Peichl | |
| 5,579,040 A | 11/1996 | Sato et al. | |
| 5,703,436 A | 12/1997 | Forrest et al. | |
| 5,707,745 A | 1/1998 | Forrest et al. | |
| 5,766,682 A * | 6/1998 | Tsubouchi | B01D 1/14 427/248.1 |
| 5,824,157 A * | 10/1998 | Foster | B29B 15/122 118/405 |
| 5,834,893 A | 11/1998 | Bulovic et al. | |
| 5,844,363 A | 12/1998 | Gu et al. | |
| 5,863,337 A * | 1/1999 | Neuman | C03C 17/002 118/718 |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,139,639 A | 10/2000 | Kitamura et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,530,823 B1 | 3/2003 | Ahmadi et al. | |
| 6,550,990 B2 * | 4/2003 | Sakurai | G03D 5/003 118/52 |
| 6,716,656 B2 | 4/2004 | Shtein | |
| 6,749,906 B2 | 6/2004 | Van Slyke | |
| 6,815,001 B1 | 11/2004 | Mishima | |
| 7,067,170 B2 | 6/2006 | Marcus et al. | |
| 7,279,704 B2 | 10/2007 | Walters et al. | |
| 7,404,862 B2 | 6/2008 | Shtein et al. | |
| 7,431,968 B1 * | 10/2008 | Shtein et al. | C23C 14/12 427/255.6 |
| 7,503,977 B1 * | 3/2009 | O'Donnell | H01L 21/67115 118/313 |
| 7,530,778 B2 | 5/2009 | Yassour | |
| 7,603,028 B2 * | 10/2009 | Yassour | H01L 21/00 118/725 |
| 7,604,439 B2 | 10/2009 | Yassour | |
| 7,682,660 B2 | 3/2010 | Shtein et al. | |
| 7,744,957 B2 | 6/2010 | Shtein et al. | |
| 7,857,121 B2 | 12/2010 | Yassour | |
| 7,879,410 B2 | 2/2011 | Che et al. | |
| 7,908,885 B2 | 3/2011 | Devitt | |
| 7,897,210 B2 | 5/2011 | Shtein et al. | |
| 7,968,146 B2 | 6/2011 | Wagner et al. | |
| 8,293,329 B2 | 10/2012 | Forrest | |
| 8,613,496 B2 | 12/2013 | Forrest et al. | |
| 8,728,858 B2 | 5/2014 | Mohan et al. | |
| 8,851,597 B2 | 10/2014 | Forrest | |
| 8,931,431 B2 * | 1/2015 | Forrest | C23C 14/04 118/712 |
| 8,944,309 B2 | 2/2015 | Forrest et al. | |
| 9,178,184 B2 * | 11/2015 | McGraw | H01L 51/56 |
| 9,583,707 B2 * | 2/2017 | Quinn | C23C 14/12 |
| 9,797,039 B2 * | 10/2017 | Forrest | C23C 14/04 |
| 10,128,468 B2 * | 11/2018 | Quinn | C23C 14/12 |
| 10,480,056 B2 * | 11/2019 | Forrest | C23C 14/12 |
| 10,566,534 B2 * | 2/2020 | King | C23C 14/228 |
| 10,654,272 B2 * | 5/2020 | McGraw | B41J 2/16 |
| 10,654,299 B2 * | 5/2020 | Mauck | H01L 51/56 |
| 10,704,144 B2 * | 7/2020 | McGraw | C23C 16/45563 |
| 10,916,704 B2 * | 2/2021 | Hack | C23C 16/513 |
| 2002/0018190 A1 * | 2/2002 | Nogawa | G03F 7/70866 355/30 |
| 2002/0081118 A1 * | 6/2002 | Sakurai | G03D 5/003 396/564 |
| 2002/0088399 A1 * | 7/2002 | Noji | B08B 3/04 118/715 |
| 2002/0153243 A1 * | 10/2002 | Forrest | H01L 51/0077 204/192.26 |
| 2003/0032289 A1 * | 2/2003 | Martin | C23C 16/4407 438/689 |
| 2003/0037729 A1 * | 2/2003 | DeDontney | C23C 16/4412 118/715 |
| 2003/0075204 A1 * | 4/2003 | de Larios | B08B 3/04 134/21 |
| 2003/0087471 A1 | 5/2003 | Shtein | |
| 2003/0159651 A1 | 8/2003 | Sakurada | |
| 2003/0175414 A1 * | 9/2003 | Hayashi | H01L 51/0005 427/66 |
| 2003/0230980 A1 | 12/2003 | Forrest et al. | |
| 2004/0003778 A1 * | 1/2004 | Hayashi | H01L 51/0004 118/715 |
| 2004/0009303 A1 | 1/2004 | Ito et al. | |
| 2004/0035358 A1 * | 2/2004 | Basceri | C23C 16/45514 118/715 |
| 2004/0048000 A1 * | 3/2004 | Shtein | C23C 14/04 427/69 |
| 2004/0056244 A1 * | 3/2004 | Marcus | C23C 14/12 257/40 |
| 2004/0062856 A1 * | 4/2004 | Marcus | H01L 51/0003 427/66 |
| 2004/0067641 A1 * | 4/2004 | Yudovsky | C23C 16/54 438/680 |
| 2004/0082183 A1 * | 4/2004 | Mori | B41J 2/16552 438/704 |
| 2004/0099213 A1 * | 5/2004 | Adomaitis | C23C 16/4412 118/715 |
| 2004/0106072 A1 * | 6/2004 | Itoh | G03F 7/30 430/329 |
| 2004/0147113 A1 | 7/2004 | Yamazaki | |
| 2004/0170762 A1 | 9/2004 | Newsome | |
| 2004/0174116 A1 | 9/2004 | Lu et al. | |
| 2004/0207800 A1 | 10/2004 | Hiruma et al. | |
| 2004/0224433 A1 * | 11/2004 | Yamazaki | H01L 51/0004 438/39 |
| 2004/0263586 A1 | 12/2004 | Steiner | |
| 2005/0006343 A1 * | 1/2005 | Choi | B29C 43/003 216/59 |
| 2005/0011752 A1 | 1/2005 | Yamazaki et al. | |
| 2005/0030496 A1 * | 2/2005 | Chibana | G03F 7/70933 355/30 |
| 2005/0045096 A1 * | 3/2005 | Kojima | H01L 21/02 118/323 |
| 2005/0072755 A1 * | 4/2005 | McMackin | G03F 7/0002 216/44 |
| 2005/0079639 A1 * | 4/2005 | Itoh | G03F 7/30 438/14 |
| 2005/0081996 A1 * | 4/2005 | Itoh | G03F 7/30 156/345.1 |
| 2005/0087131 A1 | 4/2005 | Shtein | |
| 2005/0087767 A1 * | 4/2005 | Fitzgerald | B01J 19/0093 257/200 |
| 2005/0105067 A1 * | 5/2005 | Chibana | G03F 7/70933 355/30 |
| 2005/0106511 A1 * | 5/2005 | Itoh | G03F 7/30 430/434 |
| 2005/0122351 A1 | 6/2005 | Yamazaki et al. | |
| 2005/0129339 A1 * | 6/2005 | Sai | F16C 29/025 384/12 |
| 2005/0214452 A1 | 9/2005 | Forrest | |
| 2005/0217137 A1 * | 10/2005 | Smith | H01L 21/67017 34/407 |
| 2005/0242062 A1 * | 11/2005 | Sakurai | H01L 21/6708 216/83 |
| 2005/0270516 A1 * | 12/2005 | Cherala | B82Y 10/00 355/72 |
| 2006/0045958 A1 | 3/2006 | Abiko | |
| 2006/0115585 A1 * | 6/2006 | Bulovic | H01L 51/0011 427/180 |
| 2006/0144276 A1 | 7/2006 | MacPherson | |
| 2006/0144277 A1 | 7/2006 | MacPherson | |
| 2006/0162662 A1 | 7/2006 | Sato et al. | |
| 2006/0165900 A1 | 7/2006 | Edwards et al. | |

(56) References Cited

U.S. PATENT DOCUMENTS

| | | | |
|---|---|---|---|
| 2006/0172205 A1* | 8/2006 | Sakurai | G03F 7/70558 430/5 |
| 2006/0228466 A1 | 10/2006 | Yu | |
| 2007/0013736 A1 | 1/2007 | Higginson | |
| 2007/0019172 A1* | 1/2007 | Benson | G03F 7/708 355/53 |
| 2007/0031600 A1* | 2/2007 | Devitt | C03B 35/147 427/248.1 |
| 2007/0045562 A1* | 3/2007 | Parekh | G03F 7/70341 250/455.11 |
| 2007/0063384 A1* | 3/2007 | Choi | B29C 43/003 264/319 |
| 2007/0195653 A1 | 8/2007 | Yassour | |
| 2007/0228470 A1* | 10/2007 | Levy | C23C 16/45525 257/348 |
| 2007/0238311 A1 | 10/2007 | Levy | |
| 2008/0102223 A1 | 5/2008 | Wagner et al. | |
| 2008/0122897 A1 | 5/2008 | Toyoda | |
| 2008/0145190 A1* | 6/2008 | Yassour | H01L 21/6838 414/147 |
| 2008/0152806 A1* | 6/2008 | Forrest | C23C 14/12 427/255.26 |
| 2008/0166884 A1* | 7/2008 | Nelson | C23C 16/45517 438/765 |
| 2008/0169427 A1 | 7/2008 | Hatem et al. | |
| 2008/0173200 A1* | 7/2008 | MacPherson | H01L 27/3211 101/485 |
| 2008/0173400 A1* | 7/2008 | Sakurai | H01L 21/6708 156/345.15 |
| 2008/0233287 A1* | 9/2008 | Shtein et al. | C23C 14/12 427/255.6 |
| 2008/0260940 A1* | 10/2008 | Yoon | H01L 21/76843 427/96.2 |
| 2008/0308037 A1 | 12/2008 | Bulovic | |
| 2008/0308307 A1 | 12/2008 | Chang | |
| 2008/0311289 A1 | 12/2008 | Bulovic | |
| 2008/0311307 A1 | 12/2008 | Bulovic | |
| 2009/0004405 A1 | 1/2009 | Merry et al. | |
| 2009/0041929 A1* | 2/2009 | Ohmi | C23C 14/12 427/66 |
| 2009/0061089 A1* | 3/2009 | King | B05B 7/0012 427/255.25 |
| 2009/0065776 A1 | 3/2009 | Scher | |
| 2009/0081360 A1 | 3/2009 | Fedorovskaya | |
| 2009/0081885 A1* | 3/2009 | Levy | C23C 16/45519 438/778 |
| 2009/0081886 A1 | 3/2009 | Levy | |
| 2009/0087545 A1* | 4/2009 | Ohmi | C23C 14/12 427/66 |
| 2009/0101173 A1* | 4/2009 | Peng | H01L 21/67034 134/18 |
| 2009/0104377 A1 | 4/2009 | Yoshida et al. | |
| 2009/0110823 A1* | 4/2009 | Ohmi | C23C 14/12 427/248.1 |
| 2009/0128787 A1* | 5/2009 | Yamamoto | H01L 21/6715 355/30 |
| 2009/0151752 A1* | 6/2009 | Mui | C11D 3/3723 134/21 |
| 2009/0214783 A1* | 8/2009 | Forrest | C23C 14/12 427/255.6 |
| 2009/0217878 A1* | 9/2009 | Levy | C23C 16/45551 118/729 |
| 2009/0226604 A1* | 9/2009 | Ohmi | C23C 14/12 427/66 |
| 2009/0267507 A1 | 10/2009 | Takashima | |
| 2009/0280247 A1* | 11/2009 | Forrest | C23C 14/243 427/255.6 |
| 2009/0291211 A1* | 11/2009 | Ryu | C23C 16/45551 427/255.23 |
| 2009/0304924 A1* | 12/2009 | Gadgil | C23C 16/45551 427/255.5 |
| 2010/0003396 A1 | 1/2010 | Verlee | |
| 2010/0097416 A1 | 4/2010 | Yoo et al. | |
| 2010/0129737 A1* | 5/2010 | Sakurai | G03F 1/00 430/5 |
| 2010/0171780 A1 | 7/2010 | Madigan | |
| 2010/0188457 A1 | 7/2010 | Madigan | |
| 2010/0201749 A1 | 8/2010 | Somekh | |
| 2010/0216077 A1* | 8/2010 | Nishi | G03F 7/26 430/325 |
| 2010/0245479 A1 | 9/2010 | Forrest | |
| 2010/0247766 A1* | 9/2010 | Forrest | B41J 2/005 427/255.23 |
| 2010/0269285 A1* | 10/2010 | Lin | H01L 21/67051 15/320 |
| 2011/0007107 A1 | 1/2011 | Hoisington | |
| 2011/0008541 A1* | 1/2011 | Madigan | C23C 14/04 427/256 |
| 2011/0023775 A1* | 2/2011 | Nunes | C23C 16/45582 118/58 |
| 2011/0033621 A1 | 2/2011 | Lee | |
| 2011/0045196 A1 | 2/2011 | Forrest | |
| 2011/0059259 A1 | 3/2011 | Burrows et al. | |
| 2011/0086167 A1* | 4/2011 | Nunes | C23C 16/45574 427/249.17 |
| 2011/0088621 A1* | 4/2011 | Forrest | C23C 14/12 118/715 |
| 2011/0092076 A1* | 4/2011 | Lang | C23C 14/22 438/758 |
| 2011/0095198 A1* | 4/2011 | Smiljanic | C23C 14/0063 250/396 R |
| 2011/0097495 A1 | 4/2011 | Burrows et al. | |
| 2011/0114994 A1* | 5/2011 | Mandlik | H01L 51/5203 257/100 |
| 2011/0117688 A1 | 5/2011 | Kitamura et al. | |
| 2011/0181899 A1 | 7/2011 | Stainer | |
| 2012/0003396 A1* | 1/2012 | Maas | C23C 16/45551 427/569 |
| 2012/0125258 A1* | 5/2012 | Lee | C23C 16/45536 118/719 |
| 2012/0129296 A1* | 5/2012 | Rolin | C23C 16/45565 438/99 |
| 2012/0141676 A1* | 6/2012 | Sershen | C23C 16/453 427/255.23 |
| 2012/0189766 A1* | 7/2012 | Rajala | C03C 17/002 427/8 |
| 2012/0196050 A1* | 8/2012 | Vermeer | C23C 16/45551 427/535 |
| 2012/0222620 A1* | 9/2012 | Yudovsky | C23C 16/458 118/725 |
| 2012/0244644 A1* | 9/2012 | Wang | H01L 51/0031 438/5 |
| 2012/0248219 A1* | 10/2012 | Yoon | H01L 21/28562 239/290 |
| 2013/0005057 A1* | 1/2013 | Kim | C23C 16/4412 438/26 |
| 2013/0012029 A1* | 1/2013 | Vermeer | C23C 16/0245 438/758 |
| 2013/0038649 A1* | 2/2013 | Lowrance | B41J 29/377 347/8 |
| 2013/0040061 A1* | 2/2013 | Lowrance | B41J 3/407 427/421.1 |
| 2013/0043212 A1* | 2/2013 | De Graaf | C23C 16/04 216/67 |
| 2013/0065796 A1* | 3/2013 | Francis | C23C 16/45514 506/33 |
| 2013/0070440 A1* | 3/2013 | Levermore | F21V 9/08 362/84 |
| 2013/0143415 A1* | 6/2013 | Yudovsky | C23C 16/45551 438/765 |
| 2013/0193418 A1 | 8/2013 | Ishikawa | |
| 2013/0206058 A1* | 8/2013 | Mauck | F24F 3/163 118/300 |
| 2013/0208036 A1 | 8/2013 | Forrest | |
| 2013/0224393 A1 | 8/2013 | Hospach | |
| 2013/0252533 A1* | 9/2013 | Mauck | F24F 3/14 454/187 |

(56) References Cited

U.S. PATENT DOCUMENTS

| | | | |
|---|---|---|---|
| 2013/0277663 A1* | 10/2013 | Nanno | C09D 11/30 257/40 |
| 2013/0285032 A1 | 10/2013 | Nanno | |
| 2013/0288402 A1 | 10/2013 | Morita et al. | |
| 2013/0292661 A1 | 11/2013 | Nanno | |
| 2013/0292667 A1 | 11/2013 | Nanno | |
| 2013/0321535 A1* | 12/2013 | Mauck | B41J 2/1433 347/85 |
| 2013/0323934 A1* | 12/2013 | Wada | H01G 9/2068 438/758 |
| 2014/0020628 A1* | 1/2014 | Wang | H01L 21/02104 118/721 |
| 2014/0116331 A1 | 5/2014 | Forrest et al. | |
| 2014/0138629 A1* | 5/2014 | Forrest | H01L 51/56 257/40 |
| 2014/0147587 A1* | 5/2014 | Endo | B05D 1/32 427/240 |
| 2014/0199500 A1* | 7/2014 | van Kessel | B05C 19/04 427/569 |
| 2014/0220720 A1 | 8/2014 | Harikrishna Mohan et al. | |
| 2014/0235012 A1* | 8/2014 | McGraw | C23C 14/228 438/99 |
| 2014/0290567 A1* | 10/2014 | Mauck | H01L 51/56 118/46 |
| 2014/0290579 A1 | 10/2014 | Lin et al. | |
| 2015/0011078 A1* | 1/2015 | Han | H01L 21/02639 438/500 |
| 2015/0140214 A1* | 5/2015 | Forrest | C23C 14/04 427/255.6 |
| 2015/0328910 A1* | 11/2015 | Lowrance | B41J 2/01 347/8 |
| 2015/0361546 A1* | 12/2015 | Ochi | C23C 14/04 427/255.28 |
| 2015/0368798 A1* | 12/2015 | Kwong | C23C 16/45578 118/729 |
| 2015/0376787 A1* | 12/2015 | McGraw | C23C 14/04 118/724 |
| 2015/0380648 A1* | 12/2015 | McGraw | C23C 14/04 257/40 |
| 2016/0083845 A1* | 3/2016 | Quinn | C23C 14/24 257/40 |
| 2017/0101711 A1* | 4/2017 | McGraw | C23C 14/243 |
| 2017/0104159 A1* | 4/2017 | King | H01L 51/008 |
| 2017/0162835 A1* | 6/2017 | Quinn | B05B 12/18 |
| 2017/0229663 A1* | 8/2017 | Tsai | H01L 51/0085 |
| 2018/0030588 A1* | 2/2018 | Forrest | C23C 14/12 |
| 2018/0331327 A9* | 11/2018 | Quinn | B41J 2/162 |
| 2018/0342675 A1* | 11/2018 | Xu | H01L 51/004 |
| 2019/0217610 A1* | 7/2019 | McGraw | B05B 1/1609 |
| 2019/0218655 A1* | 7/2019 | McGraw | C23C 14/04 |
| 2019/0221740 A1* | 7/2019 | Quinn | H01L 51/0012 |
| 2019/0232325 A1* | 8/2019 | McGraw | B05C 5/027 |
| 2019/0256968 A1* | 8/2019 | Quinn | C23C 14/04 |
| 2019/0305224 A1* | 10/2019 | Hack | H01L 51/0013 |
| 2020/0119279 A1* | 4/2020 | King | H01L 51/5088 |
| 2020/0140990 A1* | 5/2020 | Forrest | C23C 14/12 |

FOREIGN PATENT DOCUMENTS

| | | | | |
|---|---|---|---|---|
| NL | WO 2011105898 A1 * | 9/2011 | ......... | C23C 16/0245 |
| WO | 03020999 A1 | 3/2003 | | |
| WO | WO-03020999 A1 * | 3/2003 | ............ | C23C 14/24 |
| WO | 03034471 A1 | 4/2003 | | |
| WO | WO-03034471 A1 * | 4/2003 | ......... | C23C 14/042 |
| WO | 2005043641 A1 | 5/2005 | | |
| WO | WO-2005043641 A1 * | 5/2005 | ........... | C23C 14/228 |
| WO | 2008057394 | 5/2008 | | |
| WO | WO-2009149563 A1 | 12/2009 | | |
| WO | 2010011390 | 1/2010 | | |
| WO | WO-2010127328 A2 | 11/2010 | | |
| WO | WO-2012003440 A2 | 1/2012 | | |
| WO | WO-2014119548 A1 * | 8/2014 | ......... | C23C 16/042 |
| WO | WO-2014127363 A1 * | 8/2014 | ....... | C23C 16/45544 |

OTHER PUBLICATIONS

"Axis, n.1". OED Online. Mar. 2020. Oxford University Press. https://www.oed.com/view/Entry/14054?isAdvanced=false&result=1&rskey=HflQ6n& (accessed May 23, 2020). (Year: 2020).*

"Direction, n.". OED Online. Mar. 2020. Oxford University Press. https://www.oed.com/view/Entry/53301?redirectedFrom=Direction (accessed May 23, 2020). (Year: 2020).*

"Principal, adj., n., and adv.". OED Online. Mar. 2020. Oxford University Press. https://www.oed.com/view/Entry/151442?redirectedFrom=Principal (accessed May 23, 2020). (Year: 2020).*

"Chapters: Three-dimensional Geometry", in Keith R. Matthews. "Elementary Linear Algebra", pp. 149-187. 1991-2013. University of Queensland, Australia, http://www.numbertheory.org/book/ (accessed May 23, 2020). (Year: 1991).*

Gregory J. McGraw. "High Resolution Organic Vapor Jet Printing of Phosphorescent Organic Light Emitting Diode Arrays." PhD Thesis. Department of Physics. University of Michigan. Jun. 12, 2013. Available on line at: https://deepblue.lib.umich.edu/handle/2027.42/97921?show=full. (Year: 2013).*

Arnold, "Direct vapor jet printing of three color segment organic light emitting devices for white light illumination", Applied Physics Letters; 92 053301 (2008).

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

Biswas, et al., "Solvent-free, direct printing of organic semiconductors in atmosphere", Applied Physics Letters 96, 263301 (2010).

McGraw, "Organic vapor jet printing at micrometer resolution using microfluidic nozzle arrays", Applied Physics Letters 98, 013302 (2011).

Shtein, et al., "Direct mask and solvent-free printing of molecular organic semiconductors", Advanced Materials; 16 (18); pp. 1615-1620.

Extended European Search Report dated Mar. 10, 2017 as received in Application No. EP15172150.3.

Yun et al., "Digital-Mode Organic Vapor-Jet Printing (D-OVJP): Advanced Jet-on-Demand Control of Organic Thin-Film Deposition", Advanced Materials; c. 2012; vol. 24; 2857-2862.

Search Report for CN 201510359509 X dated Mar. 26, 2018, with partial English Translation.

Notice of Reason for Rejection for JP 2015-121671, dated Jun. 21, 2018, 9 pages.

Notice of Reason for Rejection for JP 2015-121671, dated Nov. 7, 2018, 7 pages.

CN Office Action for CN 10-85187141-17, dated Nov. 8, 2018, 5 pages.

CN Office Action for CN 10-7206997-20, dated Aug. 2, 2018, 6 pages.

U.S. Appl. No. 61/521,604, filed Aug. 9, 2011, in the names of Robert B. Lowrance et al., entitled "Apparatus and Methods for Control of Print Gap." pp. 1-27. (Year: 2011).

U.S. Appl. No. 61/521,631, filed Aug. 9, 2011, in the names of Robert B. Lowrance et al., entitled "Face-Down Thermal-Jet Printing Apparatus and Methods." pp. 1-51. (Year: 2011).

U.S. Appl. No. 61/728,358, filed Nov. 20, 2011, in the names of Stephen R. Forrest et al., entitled "Substrate Barrier Structure for Use with Organic Vapor Jet Printing." pp. 1-35. (Year: 2011).

Carter, Jamie, "Is OLED dead? The great hope for TV tech is fading fast," TechRadar, Sep. 15, 2014, 6 pages.

Kim, Miyoung, "Samsung rolls out OLED TV as production glitches linger," Reuters, Jun. 27, 2013, 4 pages.

Han, Chang-Wook et al., "Advanced technologies for UHD curved OLED TV," Journal of the SID, Nov. 22, 2015, 12 pages.

Quinn, William et al., "Organic Vapor Jet Printing, a Solvent-Less, Mask-Less Patterning Technology for OLED Displays," Invited Paper 10-3, SID 2017 Digest, 4 pages.

(56) References Cited

OTHER PUBLICATIONS

Geffroy, Bernard et al., "Organic light-emitting diode (OLED) technology: materials, devices and display technologies," Polymer International, 55:572-582 (2006).

* cited by examiner

View from substrate

SPATIAL CONTROL OF VAPOR CONDENSATION USING CONVECTION

CROSS-REFERENCE TO RELATED APPLICATIONS

This application claims the benefit of U.S. Provisional Patent Application Ser. No. 62/016,709, filed Jun. 25, 2014, and U.S. Provisional Patent Application Ser. No. 62/061,899, filed Oct. 9, 2014, the disclosures of which are incorporated by reference in their entirety. This application is related to U.S. patent application Ser. No. 13/896,744, filed May 17, 2013, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs) and, more specifically, to techniques for fabrication of such devices using convection of various gas flows. In particular, a gas curtain shaped by vacuum evacuation of a purge flow channel formed between a gas injector assembly and a substrate. In some embodiments, this may be used in combination with a nozzle adjacent to the vacuum evacuation channel to shape material flow. In other embodiments, the confinement gas does not need to be supplied through the nozzle, as the gas can come from the ambient gas in a vacuum chamber (e.g., the vacuum evacuation channel).

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

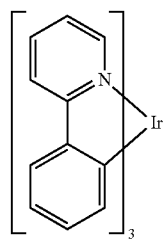

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

An embodiment of the disclosed subject matter provides a device including a nozzle, a source of material to be deposited on a substrate in fluid communication with the nozzle, a delivery gas source in fluid communication with the source of material to be deposited with the nozzle, an exhaust channel disposed adjacent to the nozzle, and a confinement gas source in fluid communication with the nozzle and the exhaust channel, and disposed adjacent to the exhaust channel.

Another embodiment of the disclosed subject matter provides a method including ejecting a delivery gas and a material to be deposited on a substrate from a nozzle, providing a confinement gas having a flow direction opposing a flow direction of the delivery gas ejected from the nozzle, and providing a vacuum source adjacent to a delivery gas aperture of the nozzle.

Another embodiment of the disclosed subject matter provides a nozzle assembly including a plurality of nozzles, with each nozzle comprising at least three separate types of flow channels which include a delivery channel to provide a delivery gas including an organic material, exhaust channels arranged adjacent to the delivery channel to evacuate gas from an area disposed between the nozzle assembly and a substrate, and confinement gas channels arranged adjacent to the exhaust channels to supply a confinement gas flow.

Another embodiment of the disclosed subject matter includes providing a method including forming a nozzle assembly having a plurality of nozzles, with each nozzle comprising at least three separate types of flow channels, including forming a first channel to provide a delivery gas including an organic material, forming a plurality of second channels arranged adjacent to the first channel to evacuate gas from an area disposed between the nozzle assembly and a substrate, and forming a plurality of confinement gas channels arranged adjacent to the plurality of second channels to supply a confinement gas flow.

Another embodiment of the disclosed subject matter provides a deposition system including a nozzle assembly having a plurality of nozzles, with each nozzle comprising at least three separate types of flow channels which include a first channel to provide a delivery gas including an organic material, a plurality of second channels arranged adjacent to the first channel to evacuate gas from an area disposed between the nozzle assembly and a substrate, and a pair of confinement gas channels arranged adjacent to the plurality of second channels to supply a confinement gas flow.

Another embodiment of the disclosed subject matter provides a display fabricated using a nozzle assembly to deposit organic materials, the nozzle assembly having a plurality of nozzles, with each nozzle comprising a plurality of separate types of flow channels which include a first channel to provide a delivery gas including an organic material, a plurality of second channels arranged adjacent to the first channel to evacuate gas from an area disposed between the nozzle assembly and a substrate, and a plurality of confinement gas channels arranged adjacent to the plurality of second channels to supply a confinement gas flow.

According to another embodiment, a first device comprising a first organic light emitting device is also provided. The first organic light emitting device can include an anode, a cathode, and an organic layer, disposed between the anode and the cathode. The organic layer can be formed by a device including a nozzle, a source of material to be deposited on a substrate in fluid communication with the nozzle, a delivery gas source in fluid communication with the source of material to be deposited with the nozzle, an exhaust channel disposed adjacent to the nozzle, and a confinement gas source in fluid communication with the nozzle and the exhaust channel, and disposed adjacent to the exhaust channel. The first device can be a consumer product, an organic light-emitting device, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
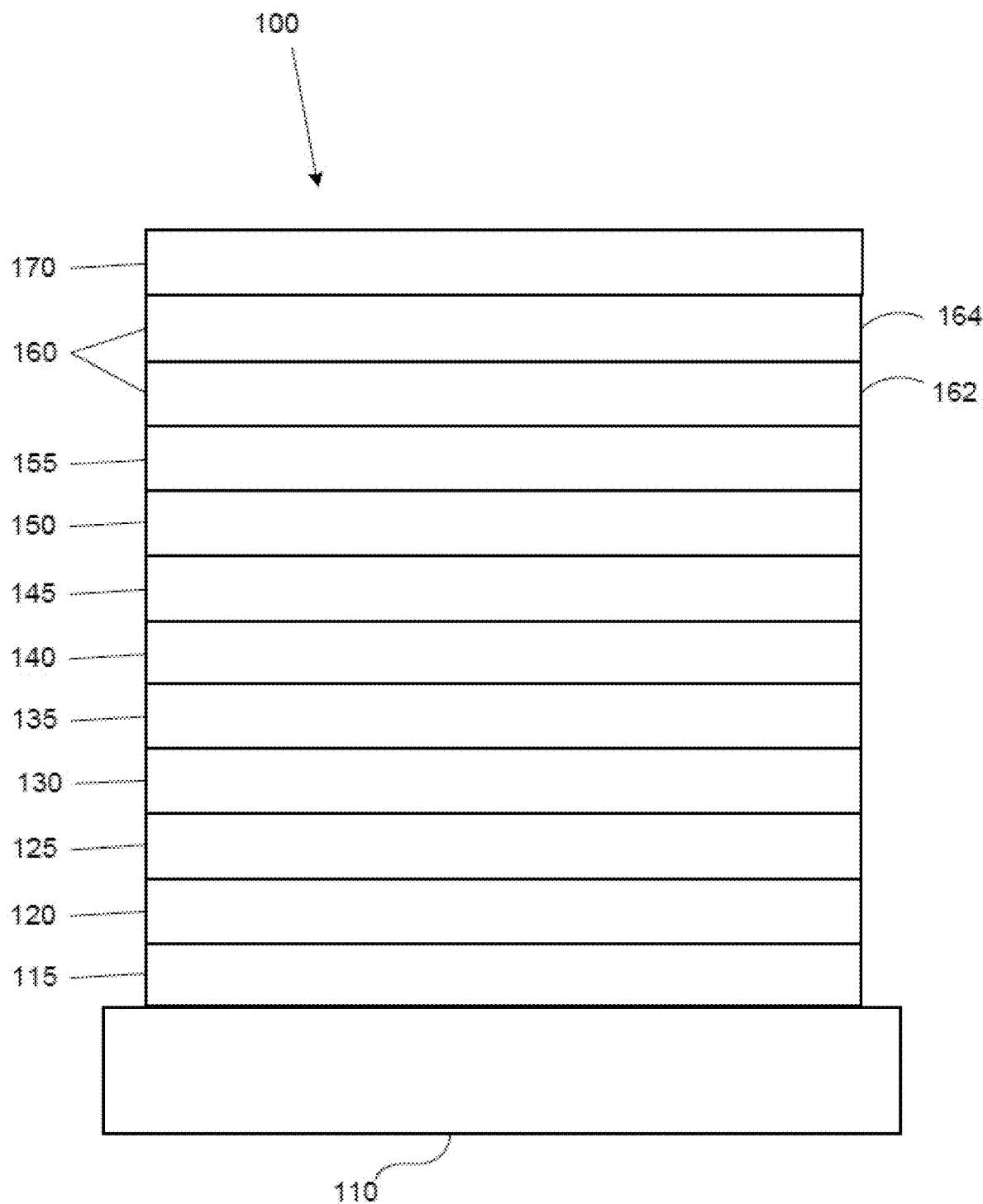
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
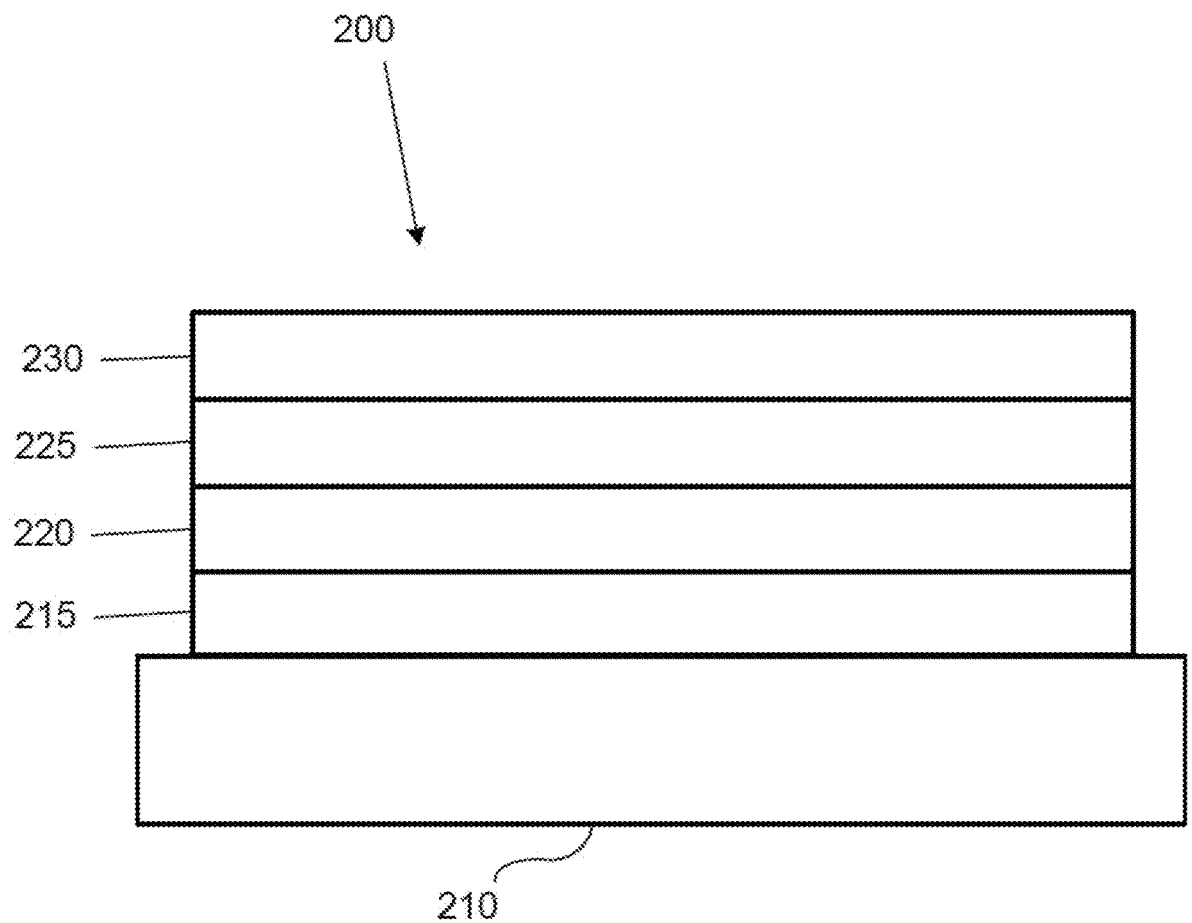
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order.

Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20°-25° C.), but could be used outside this temperature range, for example, from −40° C. to +80° C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Although U.S. Provisional Patent Application Ser. No. 62/016,709, from which this application claims priority and is incorporated by reference herein, may utilize different terms than the present application, there is no difference in the meaning of the terms. For example, purge gas may be referred as confinement gas in the present application, carrier gas may be referred to as delivery gas, evacuation channels may be referred to as exhaust channels, a carrier gas nozzle may be referred to as a delivery aperture, a sweep gas may be referred to as a confinement gas, a nozzle orifice may be referred to as a nozzle aperture or delivery channel, and a vacuum vent may be referred to as an exhaust channel, and the like.

As utilized herein, the terms confinement flow and/or confinement gas refer to gases and gas flows that may come in from outside of a deposition zone and may reduce the spread of organic vapor by opposing an in-substrate plane motion of a delivery gas flow. Confinement flow and/or confinement gas may drive surplus organic material into exhaust apertures that are coupled to exhaust channels. That is, a confinement flow may include a confinement gas, which generally has a higher molecular weight than a delivery gas.

A confinement gas may be drawn from a chamber ambient or introduced through specialized nozzles (e.g., confinement apertures that are coupled to confinement channels). When the confinement gas comes from the chamber, the confinement channel may be the gap underneath a nozzle array at fly height, which may be the gap between the nozzle and substrate.

A delivery aperture may be the intersection of the delivery channel and the edge of the print head proximal to the substrate. It may be subdivided to smaller apertures.

A delivery flow and/or delivery gas may entrain organic vapor from source ovens and carry it through a delivery channel to a deposition zone on a substrate proximal to a print head tip. The delivery flow can be a mixture of flows from multiple source ovens. The delivery gas may be helium and/or any other suitable gas.

A delivery channel may lead organic vapor from one or more sources towards the substrate. The delivery channel may be generally oriented along the substrate normal, but it can also be angled. The delivery channel intersection with the print head edge may define the delivery aperture.

An exhaust aperture and/or exhaust channel may surround the delivery channel. It can be oriented in parallel with the delivery channel or angled relative to it. Typically the exhaust is configured to remove delivery gas from a deposition zone. When a confinement gas is present, the confinement flow established between the confinement flow source and the exhaust channel removes surplus organic vapor from the deposition zone. The exhaust channel intersection with the print head edge defines the exhaust aperture.

A nozzle may be a single, microfabricated unit of a nozzle assembly including the delivery and exhaust apertures, as well as the confinement apertures when present.

A nozzle block may be one-piece microfabricated assembly having one or more nozzles. The nozzle block may be held over the substrate by a heated clamp.

A print head may include the nozzle block and the heated holder containing the fluid connections necessary to interface the nozzle block with one or more sources such as source ovens, an exhaust line to the outside of the chamber, and a confinement gas source.

As previously described, various techniques may be used to fabricate OLEDs and other similar devices, including organic vapor jet printing (OVJP). In OVJP, patterned arrays of organic thin film features may be deposited without the use of liquid solvents or shadow masks. An inert delivery gas transports organic vapor from evaporation sources to a nozzle array. The nozzle array generates a jet of gas-vapor mixture that impinges on a substrate. The organic vapor condenses on the substrate in a well-defined spot. Features can be drawn by moving the substrate relative to the print head. Co-deposition of host and dopant, as may be desirable for phosphorescent OLEDs, can be achieved by mixing vapors from different sources upstream of the nozzle. Microfabricated nozzle arrays have been demonstrated to achieve printing resolution comparable to that required for display applications.

Deposition of organic material beyond the intended boundaries of a printed feature, or overspray, is a frequent problem of OVJP. A molecule of organic vapor that comes into contact with the substrate can either irreversibly adsorb to it or reflect away from it. Adsorbed material condenses to become part of a printed feature. Material that does not condense is scattered back into the surrounding gas ambient. The sticking coefficient $\alpha$ is defined as the probability that a molecule of organic vapor condenses per encounter with the substrate. Sticking coefficients of 0.8 to 0.9 are typical of OLED materials.

Molecules of organic vapor may reflect away from the substrate rather than adsorbing to it. This may cause deposition beyond intended boundaries, since the vapor has the potential to contaminate neighboring features. A variety of transport mechanisms may carry dilute organic vapor away from the nozzle. When the gas flow is dominated by intermolecular interactions, i.e. for Knudsen numbers Kn less than 1 (Kn=$\lambda$/l, where $\lambda$ is the mean free path in the delivery gas field and l is the characteristic length of the nozzle assembly), the organic vapor plume emanating from the nozzle is broadened by both convection and diffusion. When Kn is greater than 1, printed features are broadened by ballistic motion of vapor molecules transverse to the substrate normal. In either case, feature broadening may be exacerbated if organic molecules do not adsorb upon contact with the substrate.

Figure 3:
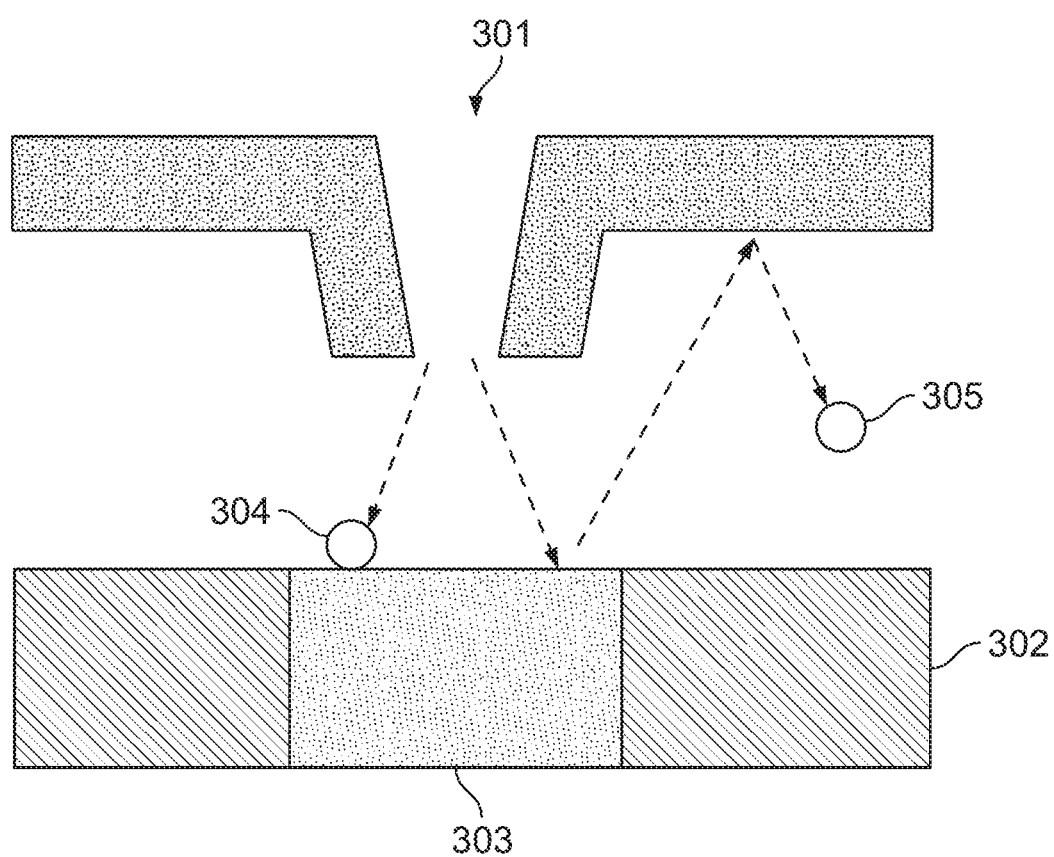
FIG. 3 shows a schematic representation of overspray in a conventional OVJP or similar system.

Convective and diffusive broadening may be minimized by operating an OVJP process at a very low background pressure, for example, less than 10-4 Torr. However, overspray may persist due to non-unity $\alpha$ as shown in FIG. 3. Fine features may be printed with OVJP, for example, by placing a heated nozzle array 301 close to the substrate 302. Organic molecules that fail to adsorb on the substrate 302 may reflect back onto the underside of the nozzle array 301 and become scattered beyond the desired printing area 303. Organic molecules that may initially adsorb (e.g., molecules 304) to the substrate 302 stay within the desired printing area 303, while molecules that do not adsorb (e.g., molecules 305) may be scattered further afield. The nozzle of the nozzle array 301 may be heated so that organic molecules (e.g., molecules 305) do not stick to its underside, and instead may be redirected onto the substrate 302 where they may land outside of the desired deposition area (e.g., desired printing area 303). Thus, it is desirable for material that does not adsorb to the substrate to be rapidly removed to minimize and/or prevent feature broadening, as described in further detail herein.

Figure 4:
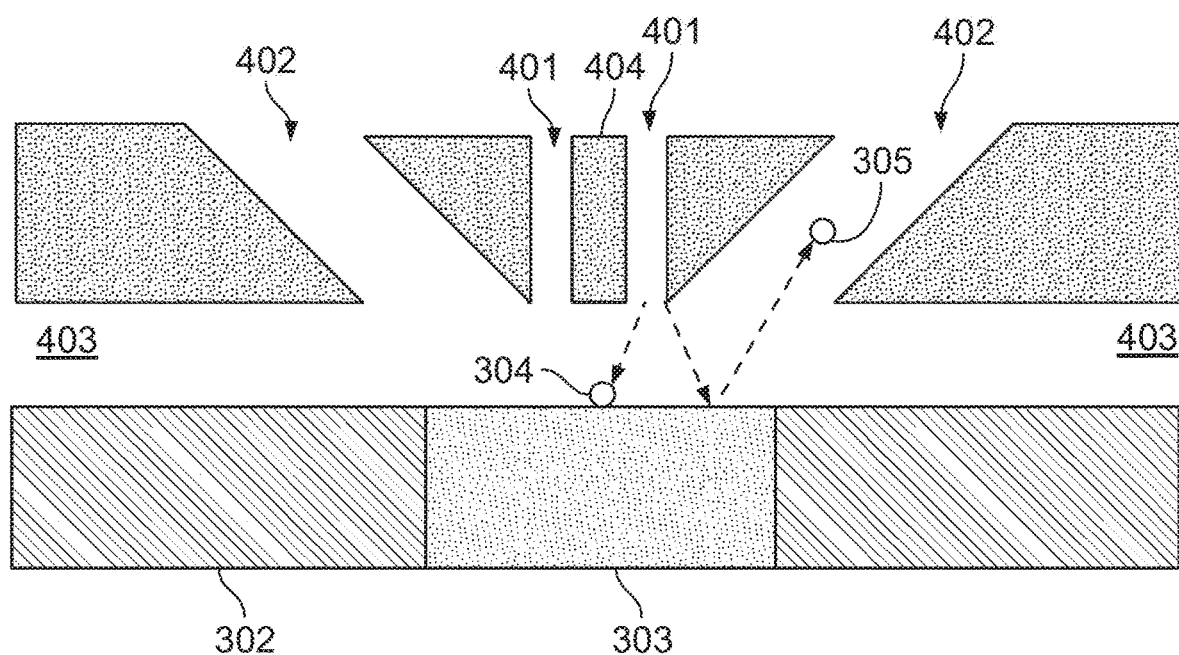
FIG. 4 shows a cross sectional diagram of a deposition structure according to an embodiment of the disclosed subject matter.

FIG. 4 shows a cross sectional diagram of a deposition structure (e.g., a nozzle assembly 400) according to an embodiment of the disclosed subject matter. A delivery channel 401 may be adjacent to, or surrounded by one or more exhaust channels 402. A delivery gas transporting a material to be deposited on a substrate 302 may be ejected from an aperture of the delivery channel 401 toward the substrate 302. Organic molecules that do not adsorb to the substrate (e.g., molecules 305) may be removed through the exhaust channel 402. A confinement gas 403 may be provided in a direction opposing the flow of material ejected from the aperture of the delivery channel of the nozzle. The confinement gas 403 may be provided from a source, such as a nozzle, an ambient source, or the like, from a location below the nozzle (i.e., between an aperture of the nozzle and the substrate 302) and adjacent to the nozzle and/or the exhaust channel 402. In some configurations, the confinement gas may be provided via a nozzle that is integrated with or integrally part of the nozzle block. Such a nozzle may be used even where the confinement gas flow is provided from the ambient environment. For example, a nozzle block may include one or more channels etched into the bottom of the nozzle block, through which the confinement gas 403 may be directed. One or more external nozzles (i.e., that are not integral with the nozzle block) may be used to direct the confinement gas into the deposition region. The confinement gas provided to the region between the nozzle assembly 400 and the substrate 302 may be chilled, such that it has an average temperature lower than the ambient temperature of a chamber in which the deposition is performed. It also may be provided at ambient temperature, or at a temperature higher than ambient.

The confinement gas may flow inward from the outside of the deposition zone and guide surplus material into the exhaust channels 402. The confinement gas flow may oppose the flow of material ejected from the nozzle if the majority of the confinement gas flow is primarily in a direction anti-parallel to a direction in which the majority of the material ejected from the nozzle flows. Flow out of the nozzle (e.g., the delivery channel 401) in the deposition zone may be primarily defined by the gap between the nozzle block and substrate 301, rather than by the geometry of the nozzle itself. A confinement gas flow in the plane of the substrate 302 can therefore be considered to oppose a nozzle flow (e.g., a flow from an aperture of the delivery channel 401), regardless of the orientation of the nozzle. For example, if the nozzle (e.g., an aperture of the delivery channel 401) is oriented to eject material in a direction perpendicular to the plane of the substrate 302, material ejected from the nozzle is redirected by the substrate 302 so that it travels in the plane of the substrate 302. Ejected material is then redirected out of the plane of the substrate 302 further downstream from the nozzle (e.g., the aperture of the delivery channel 401) where it intersects a confinement gas flow moving in the opposite direction. The stream of confinement gas can originate either from the chamber ambient or from dedicated nozzles connected to an external gas source.

The exhaust channel 402 may be connected to a vacuum source, i.e., a source of pressure lower than that of the region between the nozzle (e.g., an aperture of the delivery channel 401) and the substrate 302. The vacuum source may be external to the deposition structure (e.g., the nozzle assembly 400). For example, the nozzle block or other deposition mechanism may include a connector configured to connect the exhaust channel 402 to an external vacuum source. The exhaust channel 402 may be angled, relative to the delivery channel 401, to allow sufficient material between the exhaust channel 402 and the delivery channel 401 within the nozzle block. This configuration may provide sufficient material in the nozzle block between the channels (e.g., the delivery channel 401 and the exhaust channel 402) for the nozzle block to be structurally sound. The exhaust channel 402 within the nozzle block may be angled relative to the delivery channel 401. Such a configuration may improve the uniformity of the deposited material on the substrate. Compared to a "straight" exhaust channel passage with an axis of flow normal to the substrate, an angled passage may minimize and/or prevent formation of sharp angle through which the confinement gas, delivery gas, and/or undeposited material would have to flow, as shown in further detail in the examples and simulations disclosed herein.

The exhaust channel 402 may surround the nozzle passage (e.g., the delivery channel 401) within the nozzle block (e.g., the nozzle assembly 400). For example, the exhaust channel 402 may be of sufficient width within the nozzle block (e.g., the nozzle assembly 400) such that the smallest distance between the delivery channel 401 and the exhaust channel 402 is the same in at least two directions relative to the nozzle. In some configurations, the nozzle aperture may be defined by the planar edge of the nozzle block and a channel within the nozzle block. That is, a nozzle as disclosed herein may not require an additional tapered and/or other extended physical portion that extends beyond a lower surface of the nozzle block.

The nozzle aperture (e.g., delivery channel 401) can be bifurcated or otherwise divided by delivery channel separator 404 to include multiple apertures (e.g., multiple delivery channels 401, as shown in FIG. 4). The delivery channel 401 that is divided by the delivery channel separator 404 may improve the uniformity of organic material flux onto the substrate 302 within the deposition zone. For example, without bifurcation (e.g., without the presence of the delivery channel separator 404), a raised or rounded deposition profile may result. In contrast, when the nozzle is bifurcated (e.g., the delivery channel 401 is divided by the delivery channel separator 404), the blocking material in the center of the nozzle may prevent material from depositing in the middle of the deposition area, leading to a flatter, "plateau" type deposition profile. More generally, a nozzle as disclosed herein may include multiple apertures.

Nozzles as disclosed herein may be oriented vertically, i.e., positioned such that the axis of the delivery channel is perpendicular to a substrate on which material ejected by the nozzle is to be deposited. Alternatively or in addition, one or more nozzles may be positioned at an angle relative to the substrate, such as an angle between 0° and 90°.

A nozzle block as disclosed herein may include multiple delivery apertures and/or multiple exhaust channels, which may be disposed in any suitable arrangement within the nozzle block. For example, multiple delivery apertures may be disposed within a nozzle block, with exhaust channels disposed between adjacent nozzles. When multiple nozzles are used within a single nozzle block, they may be disposed in any suitable arrangement, such as a linear, staggered, or layered arrangement. Each arrangement of nozzles may be used to perform different ordered or simultaneous deposition. For example, in a linear arrangement, each nozzle may deposit a different layer over a single substrate that is moved past each nozzle in the linear arrangement in turn.

In some embodiments of the disclosed subject matter, the nozzle block, or a portion of the nozzle block, may be heated to a temperature higher than the evaporation point of the least volatile organic material in the delivery gas ejected by the nozzles. This may further minimize and/or prevent the material from condensing on various parts of the deposition apparatus.

Deposition systems as disclosed herein also may include a substrate holder or other arrangement configured to position the substrate 302 below the nozzle (e.g., the delivery channel 401). In some configurations, the substrate holder may be positioned relative to the nozzle such that a substrate 302 placed on the substrate holder is positioned about 10-1000 μm below the nozzle aperture.

In some embodiments of the disclosed subject matter, a chiller plate (e.g., a thermoelectric cooler) or other lower-temperature device or region may be disposed adjacent to the nozzle surface (e.g., the surface having an aperture of the delivery channel 401) of the nozzle block (e.g., the nozzle assembly 400). For example, a chiller plate may be disposed adjacent to the lower surface of a nozzle block facing the substrate 302, adjacent to one or more nozzles. A chiller plate also may be disposed adjacent to the nozzle block, but may not be in physical contact with the nozzle block.

In some embodiments of the disclosed subject matter, the deposition systems and techniques disclosed herein may be performed within a deposition chamber. The chamber may be filled with one or more gases, which may be used to provide the confinement gas flow as previously disclosed. In some embodiments, the deposition chamber may be filled with one or more gases, such that the ambient environment in the chamber has a composition different from that of the confinement gas and/or the delivery gas or gases used as disclosed herein. The deposition chamber may be maintained at any suitable pressure, including 10 Torr, 100 Torr, 760 Torr, or the like.

Deposition systems as disclosed herein may be used to deposit various components of OLED or similar devices as previously disclosed. Alternatively, or in addition, they may be rastered across a substrate so as to deposit a uniform film of material on the substrate. For example, the deposition system may include an alignment system that rasters one or more nozzles based upon the existence and position of fiducial marks on the substrate. Devices according to embodiments of the invention may include a rastering mechanism such as a belt or other conveyor system, which allows the nozzle assembly and the substrate or substrate holder to be moved laterally relative to one another.

Figure 5:
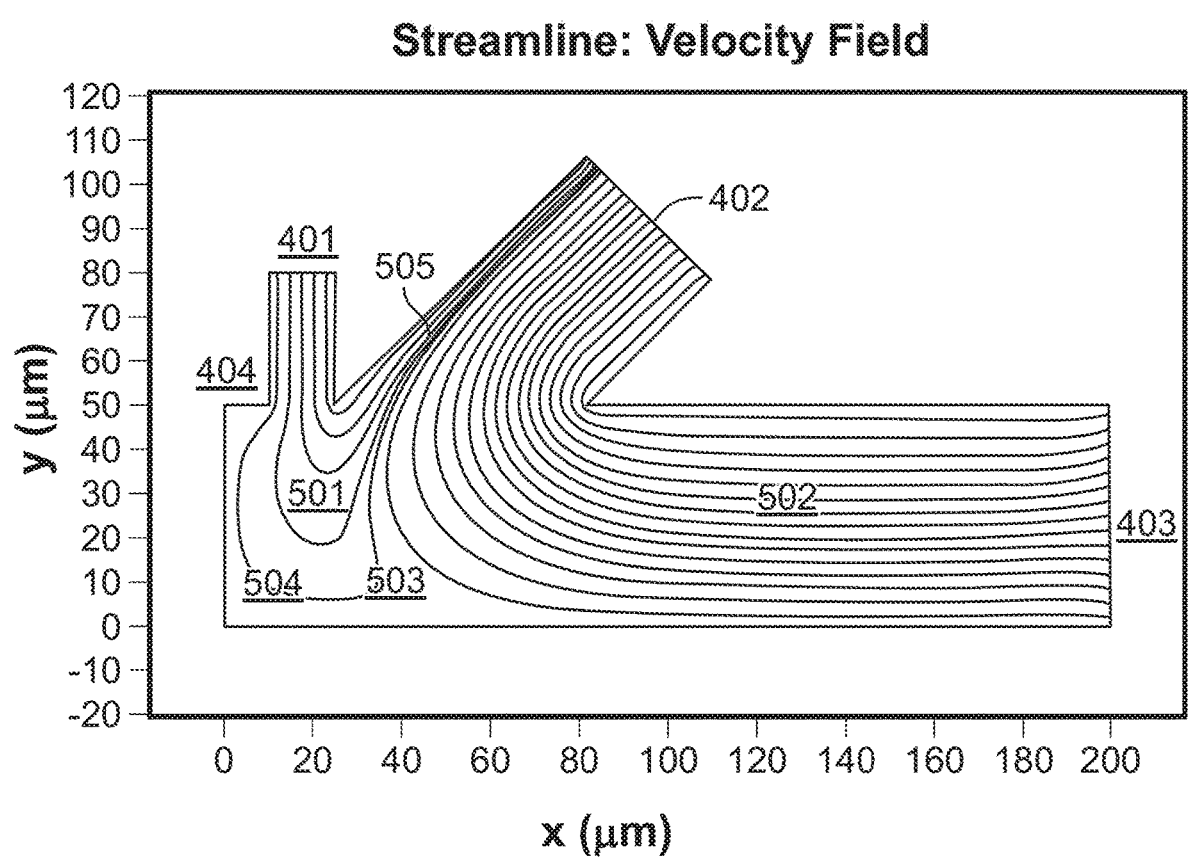
FIG. 5 shows example streamlines of delivery gas flow according to an embodiment of the disclosed subject matter.

FIG. 5 shows example streamlines of delivery gas flow according to an embodiment of the disclosed subject matter. The delivery flow 501 follows streamlines connecting the aperture of the delivery channel 401 with the exhaust channel 402. The confinement gas flow 502 follows streamlines connecting gas inlet 403 to the exhaust channel 402.

The confinement gas flow 502 generally opposes the delivery flow 501. The flows intersect 503 and turn toward the exhaust channel 402. This in turn forms a barrier, which may be referred to as a "gas curtain", to the spread of organic material along the plane of the substrate (e.g., substrate 302 of FIG. 4). Organic vapor that does not condense on the substrate under the nozzle in region 504 may remain entrained within the delivery gas flow 505 entering the exhaust (e.g., exhaust channel 402 of FIG. 4). The material is then removed from the deposition area as this flow passes through the exhaust (e.g., the exhaust channel 402 shown in FIG. 4).

Figure 6:
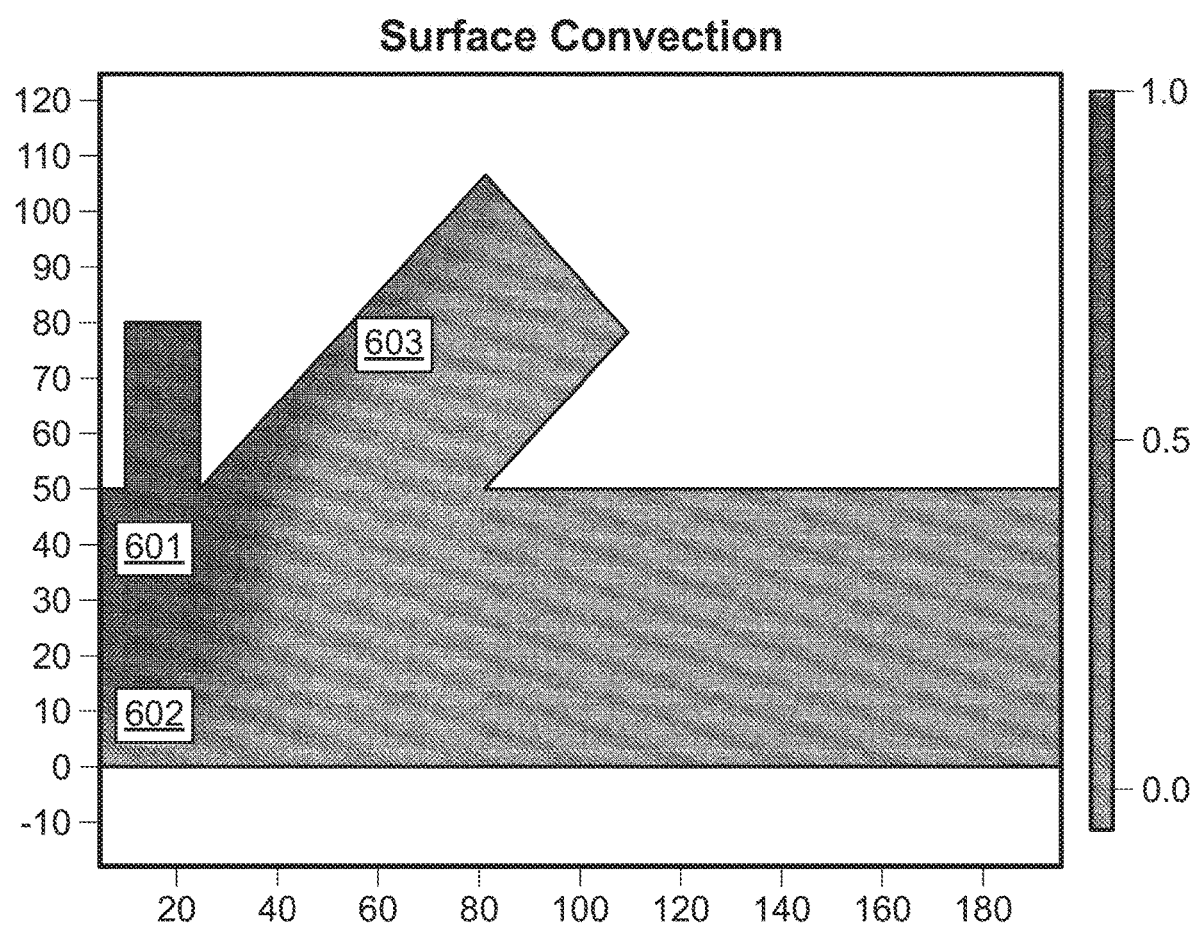
FIG. 6 shows a plot of organic vapor concentration in a flow field according to an embodiment of the disclosed subject matter.

FIG. 6 shows a plot of the concentration of organic vapor in the flow field. As shown, a plume containing a high concentration of organic vapor 601 may emanate from the delivery aperture. The material in this plume diffusively transports across a concentration gradient 602 towards the substrate. The remainder of the vapor is transported from the substrate with portion of the plume exiting the exhaust via 603. Organic vapor that does diffuse across streamlines into the confinement gas flow may be removed through the exhaust channel as the confinement gas exits. Convection from the confinement gas flow drives organic vapor upward and away from the substrate. Transport of organic vapor onto regions of substrate covered by the confinement gas flow, therefore, may be negligible.

The Peclet number Pe may be used to describe the ratio of convective and diffusive transport in such a flow:

$$Pe = lu/D,$$

where l is the characteristic length, u is the characteristic velocity, and D is the diffusivity of organic vapor in the gas ambient. In an arrangement as described with respect to FIGS. 3-6, Pe is on the order of 1-10 underneath the nozzle, and 10-100 in the confinement gas flow. Convective transport therefore dominates in the confinement gas stream, permitting effective removal of organic vapor through the exhaust channel.

Figure 7A:
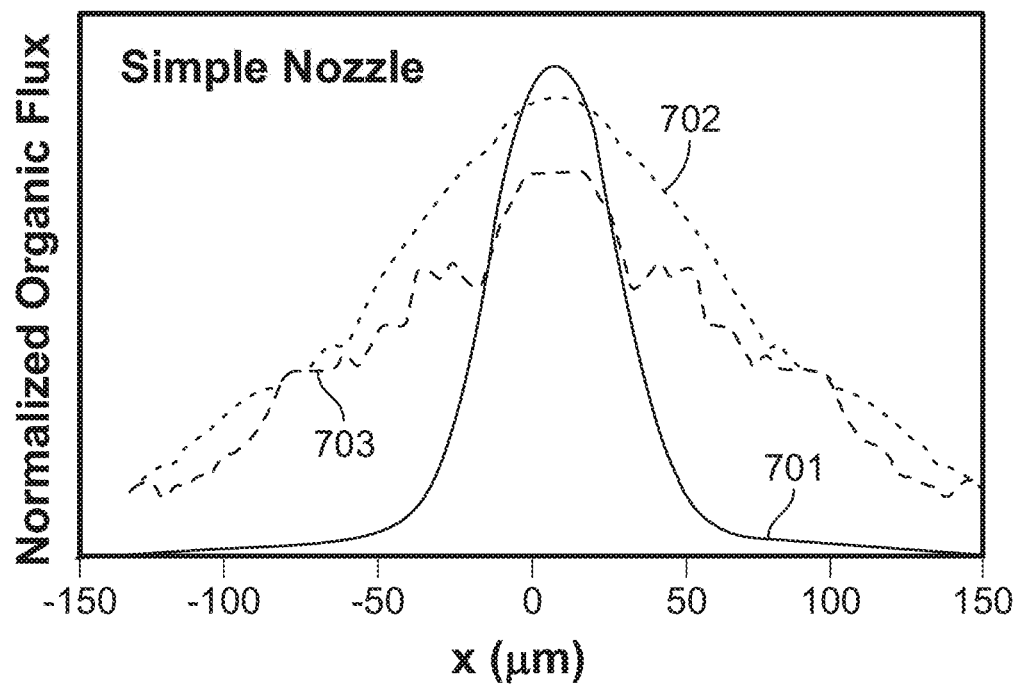
FIG. 7A shows the thickness of thin film lines as a function of in-plane distance from the nozzle centerline according to conventional overspray reduction technology for depositing materials with non-unity sticking coefficient.
Figure 7B:
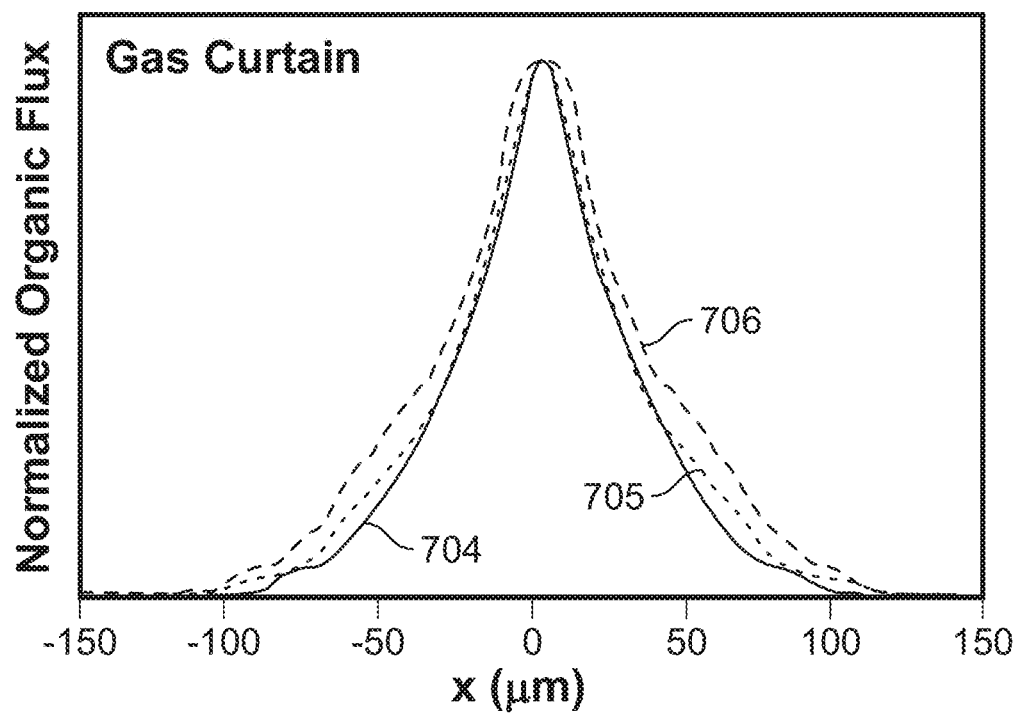
FIG. 7B shows the thickness of thin film lines as a function of in-plane distance from the nozzle centerline according to an embodiment of the disclosed subject matter.

The effectiveness of this convective transport technique, particularly when depositing organic components with sticking coefficients less than 1, is shown in FIGS. 7A and 7B. As shown in FIG. 7A, very sharply defined features 701 can be achieved when $\alpha=1$. There is significant broadening and the intended features are surrounded by broad overspray tails for the cases of $\alpha=0.5$ (702) and $\alpha=0.1$ (703), as shown in FIG. 7A. As shown in FIG. 7B, a gas curtain technique as disclosed herein may result in a wider feature profile for the case of $\alpha=1$ (704) than for a plain nozzle, but that deposition profile may remain nearly unchanged for $\alpha=0.5$ (705) and $\alpha=0.1$ (706). That is, the overspray mitigation capability of the gas curtain may be nearly independent of sticking coefficient, making it suitable for depositing a wider range of OLED materials.

Deposition systems of the embodiments of the disclosed subject matter may be fabricated using any suitable technique. For example, the features of the nozzle block may be etched into a silicon wafer using photolithography, reactive ion etching, or the like. The structure also may be fabricated by etching channels into multiple wafers that are then bonded together to form the desired three-dimensional structures, for example, using wafer bonding and/or optical alignment techniques. Suitable wafer bonding techniques may include, for example, anodic, gold eutectic, solder, Si fusion, and the like. As another example, individual dies may be singulated, such as by stealth dicing, to from a wafer structure, allowing for the nozzle tips, exhaust channels, and other ports on a nozzle block to be defined by the die edges.

Organic materials used to manufacture OLED displays are typically deposited by vacuum thermal evaporation (VTE) through shadow masks. Shadow masks may be fabricated from thin metal sheets which are stretched on frames and subsequently aligned to patterns on the substrate.

Perforations in the shadow mask may define the area of the substrate that will be covered by deposition. For large area displays, shadow masks are typically difficult to use due to mask heating and sagging, which may adversely affect yield.

Organic Vapor Jet Printing (OVJP) is a vapor deposition technology that is capable of printing narrow, pixel width lines over large areas without the use of shadow masks. Organic vapors entrained in an inert delivery gas may be ejected from a nozzle and impinge on a substrate where the vapors condense, resulting in a deposited film. The design of the nozzle may determine the size and shape of the deposit.

Figure 8:
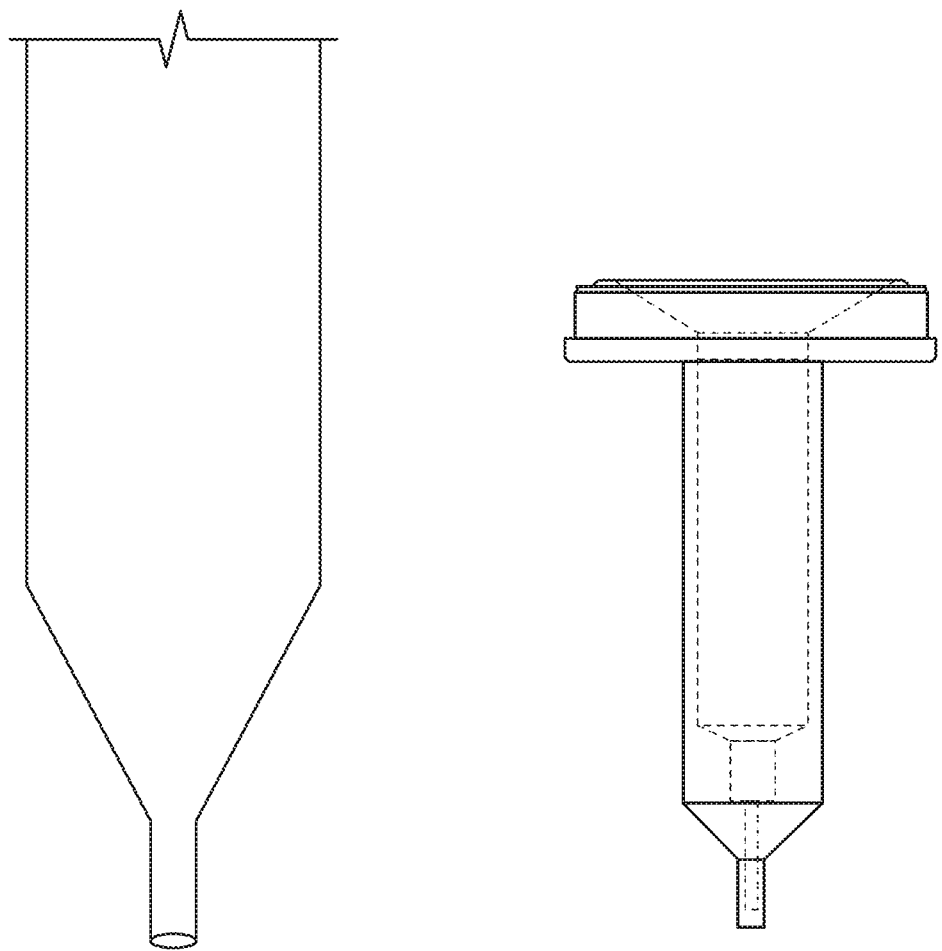
FIG. 8 shows a conventional organic vapor jet printing (OVJP) system.
Figure 9:
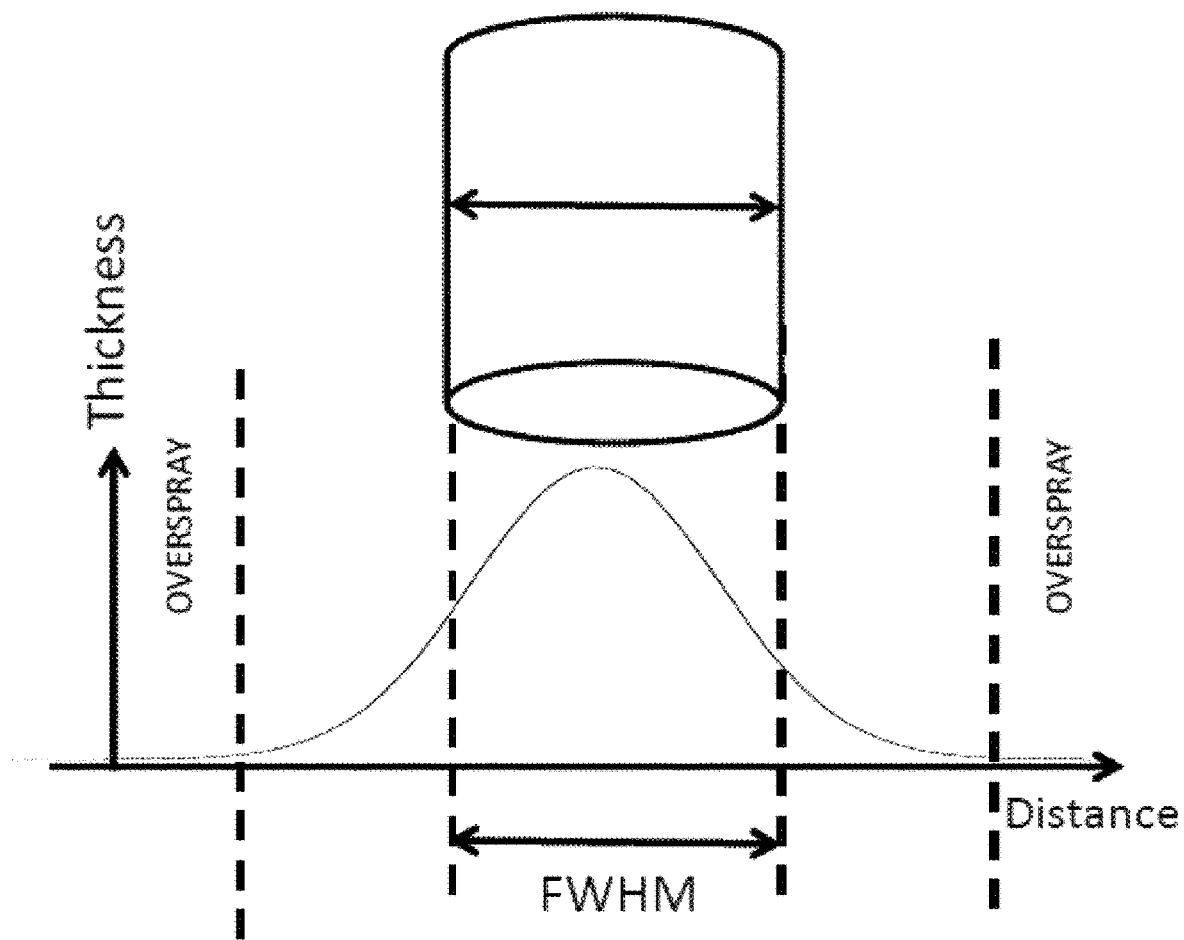
FIG. 9 shows a cross-sectional thickness profile from a conventional OVJP system.

FIG. 8 shows a first generation OVJP system that uses a round nozzle formed in metal or glass with a size limited to about 0.3 mm in diameter, which is capable of depositing lines of several mm in width. The cross sectional thickness profile related to such a nozzle is shown in FIG. 9. To deposit lines using a single OVJP nozzle, such as to manufacture a large area display, or form two-dimensional patterns, the nozzle is typically rastered over the substrate, or the substrate is rastered under a stationary nozzle. As a specific example, high definition 4K HD displays typically have 3840 rows of vertical pixels. Printing such a display, one row at a time with a single nozzle, may be very time consuming. The desired time to complete each display step (TAKT time) may be on the order of 2-5 minutes. To meet the TAKT time requirement, an array of nozzles would be required.

Depositions using individual or isolated OVJP nozzles have been analyzed, but such analysis typically ignores the effects of gas flow and deposition patterns caused by neighboring nozzles. The deposition patterns from isolated nozzles may exhibit a Gaussian thickness profile as shown in FIG. 9. The width of the pattern may be a function of the nozzle diameter, the distance between the nozzle and substrate, the deposition chamber pressure, and the flow of delivery gas and organic vapor. For this type of simple nozzle, the deposition profile width is typically much wider than the nozzle diameter. Experimental results have been obtained from single nozzles, or from arrays of nozzles, with nozzles separated by 2 mm or more to eliminate neighbor effects. When nozzles are placed in close proximity (e.g., with a range of several hundred microns), gas flowing from one nozzle can alter the deposition pattern of neighboring nozzles. To achieve the desired TAKT time to produce a large area display, many nozzles must be used. To achieve the desired pixel dimensions, the nozzles must be placed close together, where neighbor effects will dominate the deposition profiles.

Organic material may be carried from the sublimation source to the nozzle in a delivery gas, which does not condense on the substrate surface. In a two-dimensional array of nozzles in a vacuum chamber, the nozzles in the center of the array may experience a higher background pressure than nozzles at the periphery due to conductance limitations of the small gap between the substrate and nozzle array. For large arrays (e.g., arrays having about five or more nozzles), and substrate to nozzle array gaps that are much smaller that the thickness of the nozzle block, the pressure change can be substantial at the center of the array. OVJP nozzles typically produce the narrowest line widths when operated in a limited pressure and flow range. Increasing the pressure into which a nozzle is flowing may alter line width and decrease deposition rate. That is, for the nozzle design of the embodiments of the disclosed subject matter, the pressure range may be from 100 to 200 Torr, but the nozzles could be configured to work from 10 to 760 Torr. OVJP nozzles may be configured to operate in a wide range of deposition pressures, but neighbor effects may limit the size of the array, and spacing between nozzles for operating pressures.

Figure 10A:
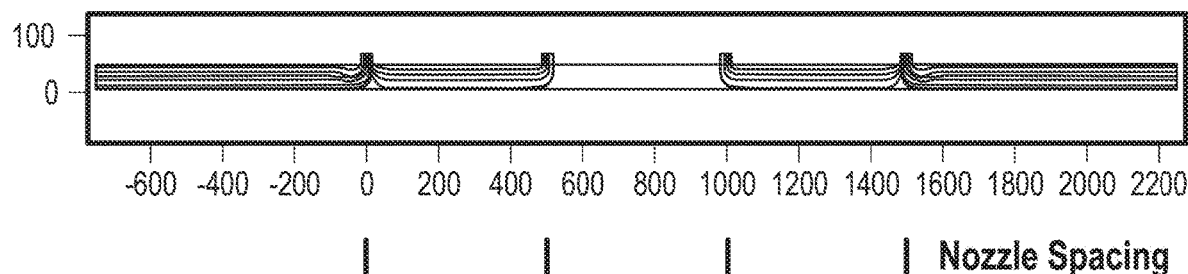
FIG. 10A shows stream lines emanating from four nozzles of a conventional linear array.
Figure 10B:
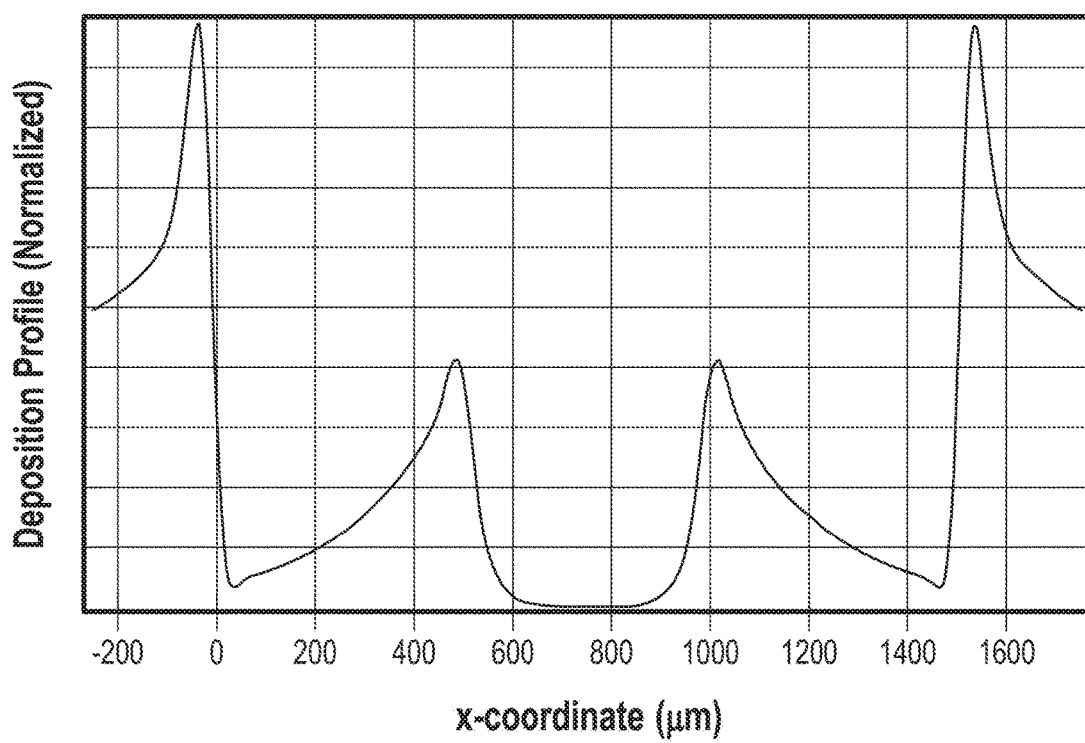
FIG. 10B shows a resulting deposition profile from the emanated stream lines of FIG. 10A of the conventional linear array.

FIGS. 10A-10B show computational fluid dynamics (CFD) modeled deposition (thickness) profile of a conventional linear array of four 30 micron wide simple nozzles spaced 500 microns apart. Delivery gas pressure for this simulation is 15,000 Pa and the chamber pressure is 10,000 Pa. FIG. 10A shows the stream lines emanating from the four nozzles. There is no flow between the second and third nozzles, which is caused by pumping from the edges of the nozzle assembly. FIG. 10B shows the resulting deposition profile. The two inner nozzles exhibit a lower deposition rate than the outer nozzles, and all deposition profiles are very broad due to gas flow between nozzles directed toward the outer edges of the nozzle assembly.

Figure 11:
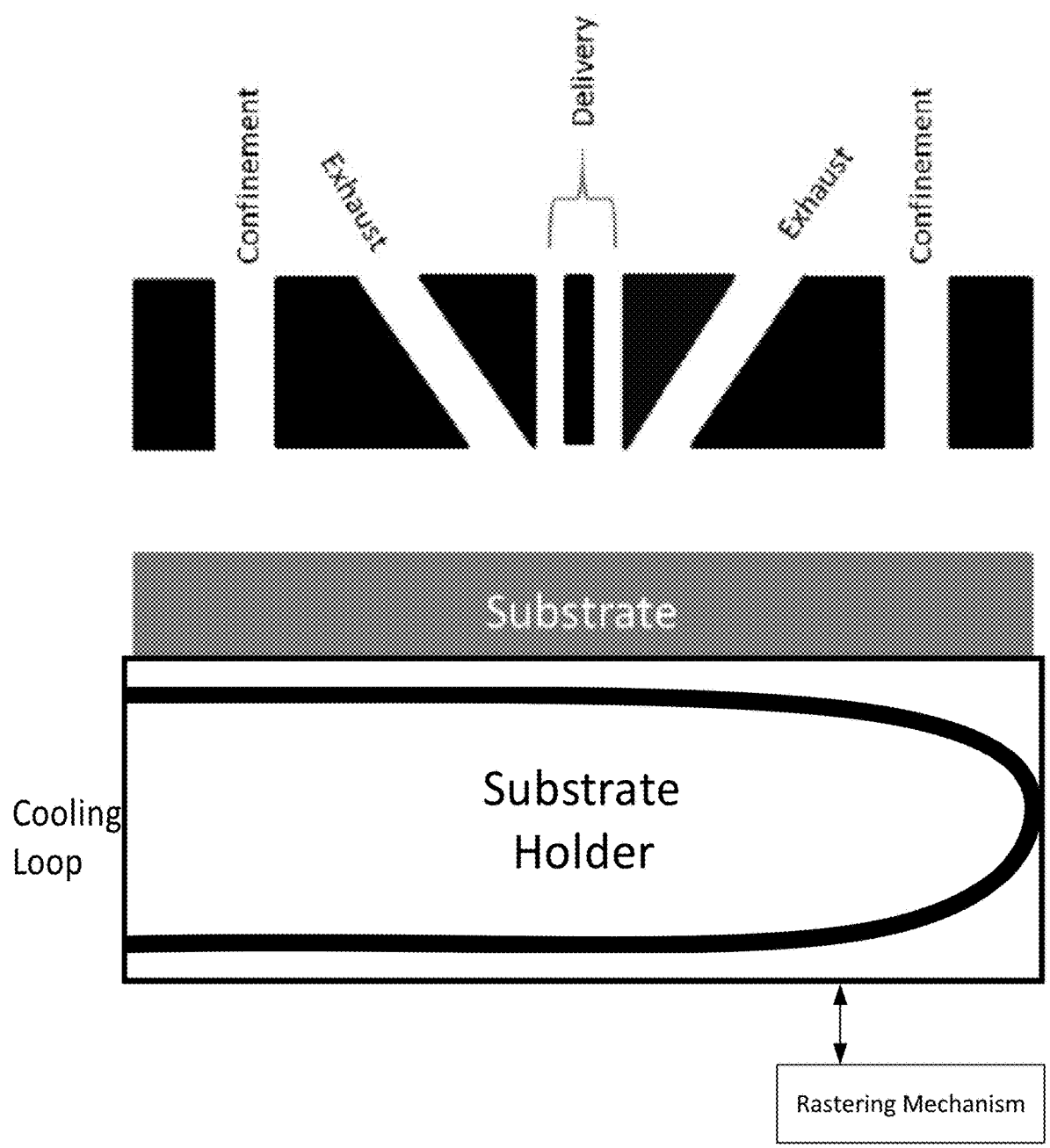
FIG. 11 shows an OVJP nozzle array according to an embodiment of the disclosed subject matter.

To reduce and/or eliminate undesired deposition, broadening gas flow between nozzles must be reduced and/or eliminated. The embodiments of the disclosed subject matter provide a nozzle that reduces and/or eliminates nearest neighbor effects and enables densely packed OVJP nozzle arrays, as shown in FIG. 11. By including balanced gas supply and exhaust in each nozzle assembly, the net change in pressure and gas flow between nozzles is eliminated. Each nozzle includes three flow elements: a delivery channel for delivery gas and organic material, an exhaust channel and a confinement gas channel (e.g., a three element nozzle). The combined flow of delivery gas and purge gas is balanced by evacuating an equivalent flow through the exhaust channel. The apertures for each of the delivery gas, confinement gas and exhaust flow channels are arranged to confine the deposit resulting from the organic material impinging on the substrate and remove surplus organic material that does not adsorb to the substrate. FIG. 11 shows one configuration of flow channels with an angled exhaust channel. Other configurations of flow channels are possible.

Figure 12:
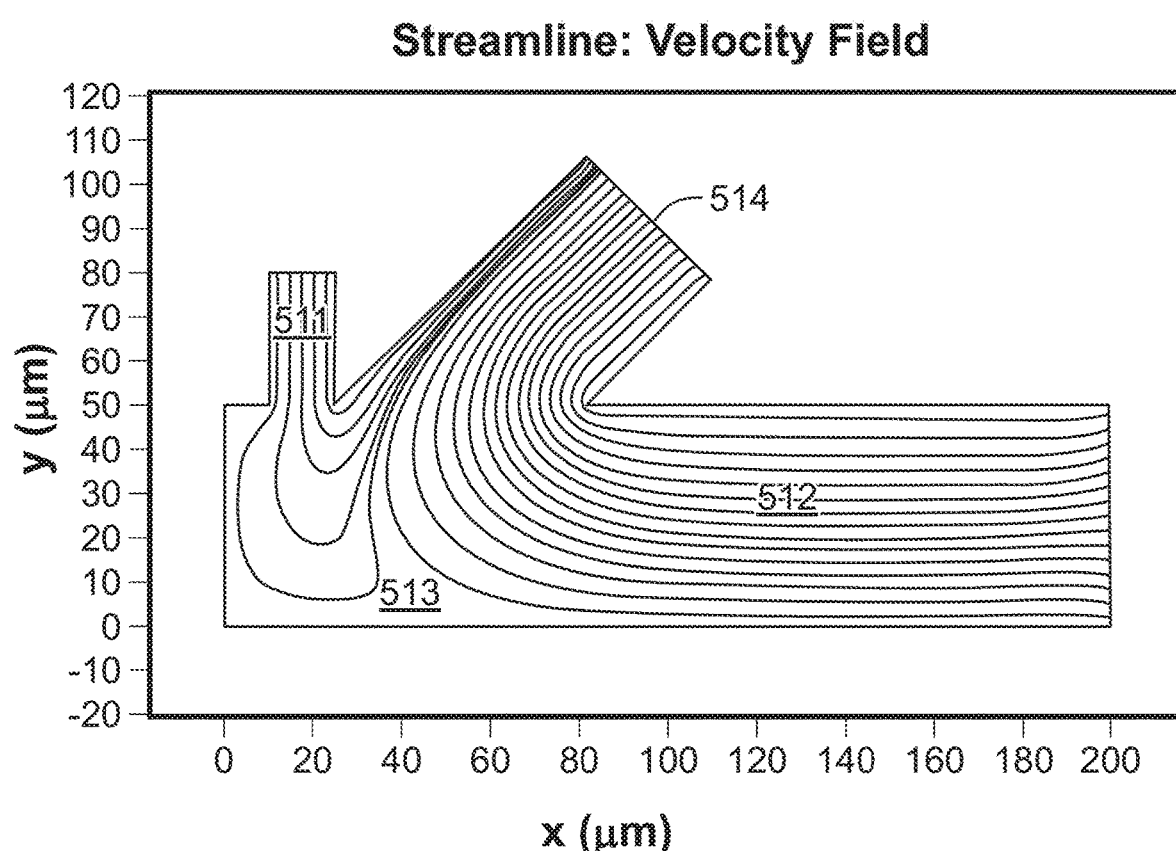
FIG. 12 shows stream lines of confinement gas flows entering from their respective sources, intersecting a region between a print head and a nozzle assembly, and exiting through an exhaust channel according to an embodiment of the disclosed subject matter.

FIG. 12 shows modeled stream lines of the delivery 511 and 512 confinement gas flows entering from their respective sources, intersecting in the region between the print head and nozzle assembly 513 and exiting through the exhaust channel 514. Spreading of the delivery gas may be limited by the opposing flow of the confinement gas.

As shown in FIG. 11, each nozzle may be constructed with the delivery channel in the center of the nozzle assembly. Exhaust channels may be located adjacent to the sides of the delivery aperture. Two confinement channels may be disposed adjacent to the exhaust channels, and farther from the center nozzle.

Figure 13:
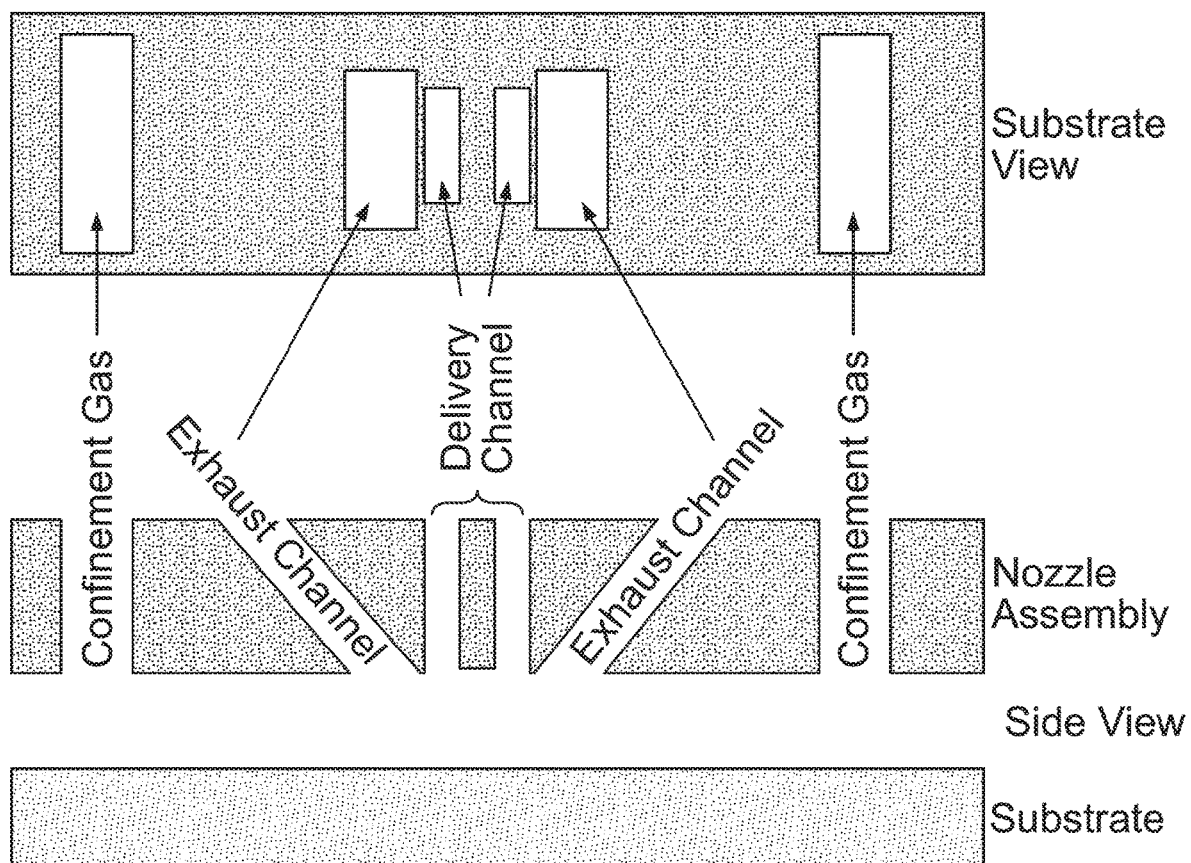
FIG. 13 shows a bifurcated delivery channel according to an embodiment of the disclosed subject matter.

The channel may form a layered structure with five flow channels (e.g., a delivery channel, two exhaust channels and two confinement gas channels) separated by non-flow regions. Viewed edge-on, the channels form five apertures. The apertures may include apertures that are communicatively coupled to the confinement gas channels, the exhaust channels, and the delivery channel. FIG. 13 shows a bifurcated delivery channel, which appears as a pair of narrow apertures. In the substrate view of FIG. 13, each aperture is shown generally rectangular in shape with the short axis perpendicular to the direction of travel over the substrate. As shown in FIG. 13, the delivery aperture has a shorter length (long axis of the nozzle) than the exhaust and confinement apertures. The spacing and shape of the apertures and gas flow in each channel may be configured so as to produce a desired printed line width, having limited or no overspray. Process conditions may be set so the net flow from each nozzle assembly is zero, the flow into the nozzle assembly is equal to the flow out of the nozzle assembly, and there is no net pressure change between neighboring nozzles.

Figure 14A:
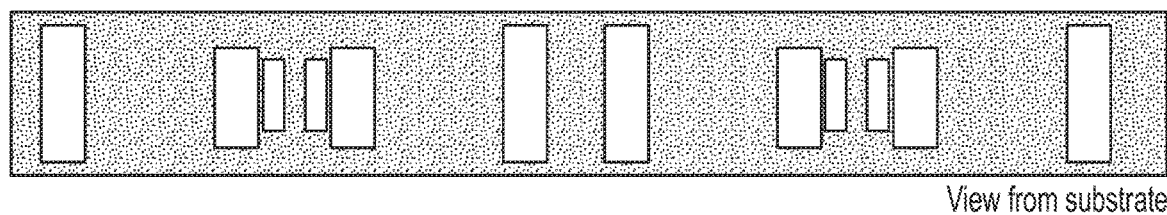
FIG. 14A shows an aperture configuration of a three element nozzle assembly according to an embodiment of the disclosed subject matter.
Figure 14B:
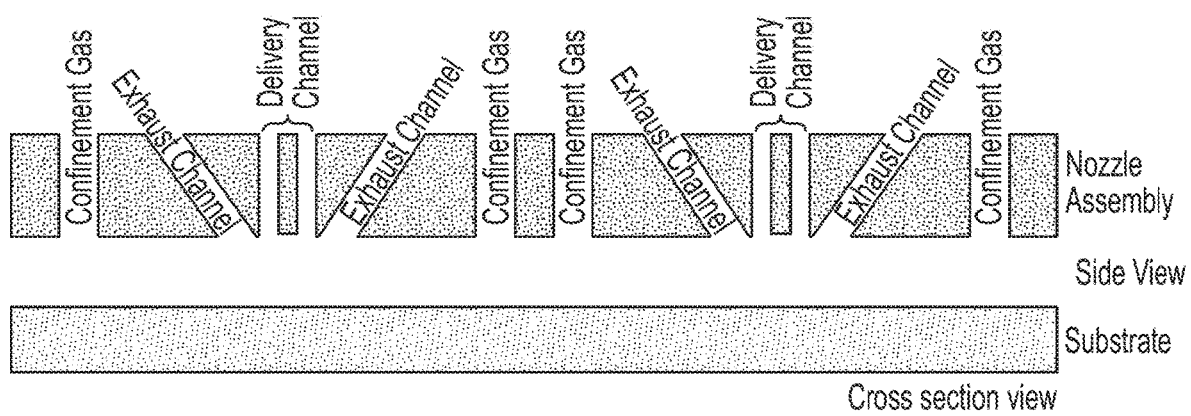
FIG. 14B shows a cross section view of flow channels on the nozzle assembly of FIG. 14A according to an embodiment of the disclosed subject matter.
Figure 14C:
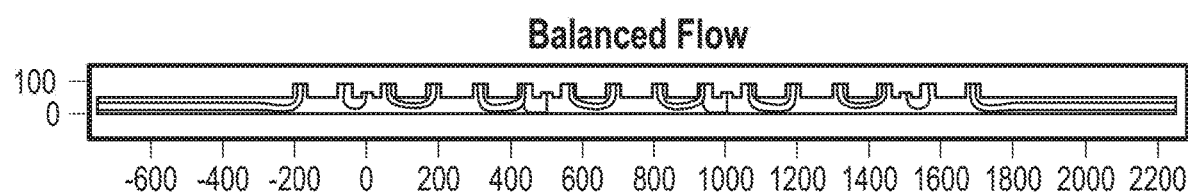
FIG. 14C shows a balanced flow from the nozzle assembly according to an embodiment of the disclosed subject matter.
Figure 14D:
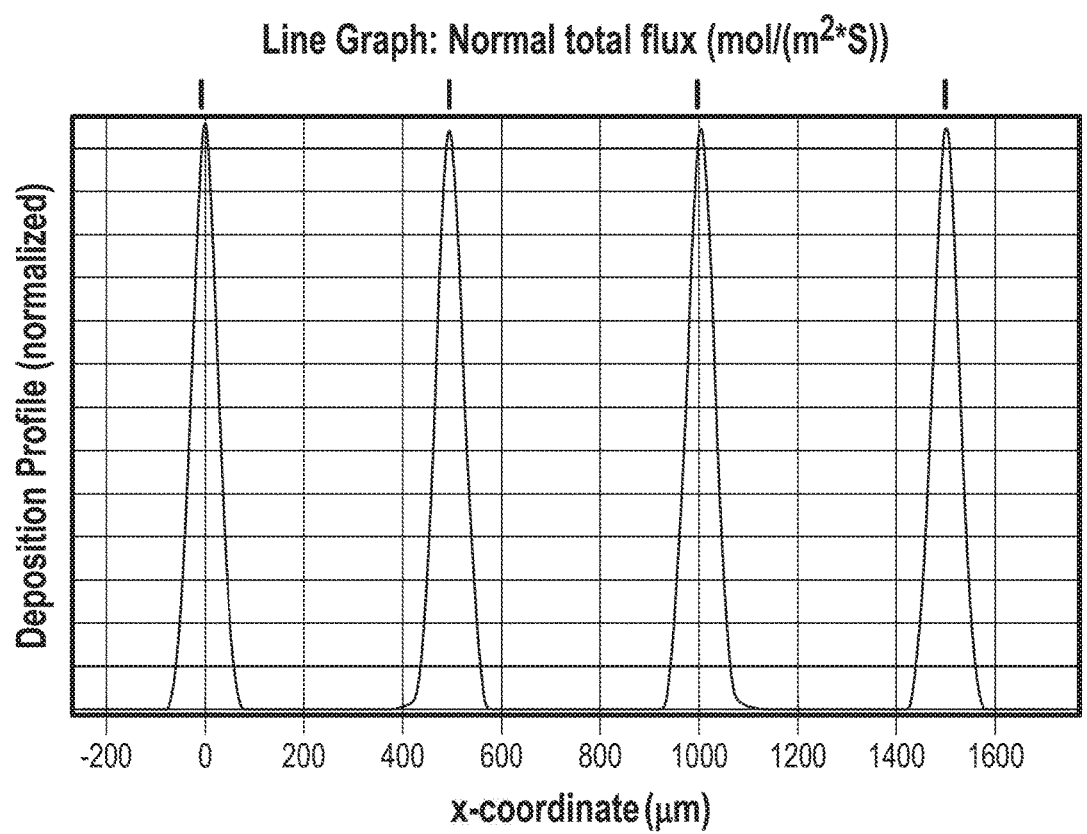
FIG. 14D shows a modeled thickness distribution of a three element nozzle array of four nozzles according to an embodiment of the disclosed subject matter.

FIGS. 14A-14D show a schematic of a linear array of simple nozzles and computational fluid dynamics (CFD) analysis of nearest neighbor effects on the deposition patterns. FIG. 14A shows the aperture configuration of the three element nozzle assembly (e.g., a delivery channel, an exhaust channel, and a confinement gas channel), and FIG. 14B is a cross-section view showing the flow channels on the nozzle assembly. FIG. 14C (i.e., the "balanced flow") shows the nozzle configuration used to model the three element nozzle array of four nozzles (i.e., each nozzle of the four nozzle array has three elements), where the modeled thickness distribution obtained using the nozzle array is shown in FIG. 14D. Process conditions for FIGS. 14A-14D are listed in Table 1.

TABLE 1

Process conditions used to obtain modeled results for FIGS. 14A-14D.

| Conditions | |
|---|---|
| Delivery Width | 30 μm |
| Delivery Pressure | 15,000 Pa |
| Delivery-Exhaust Separation | 25 μm |
| Exhaust Width | 25 μm |
| Exhaust Pressure | 5,000 Pa |
| Exhaust-Confinement Separation | 100 μm |
| Confinement Width | 25 μm |
| Confinement Pressure | 15,000 Pa |
| Left Hand Pressure | 5,000 Pa |
| Right Hand Pressure | 5,000 Pa |

FIG. 10B and FIG. 14D show a comparison of the modeled results from a four nozzle array of simple nozzles (FIG. 10B) and a four nozzle array of three element nozzles (FIG. 14D). Comparison of the single nozzle stream lines shows that flow caused by the neighboring nozzle shifts the deposition pattern in the direction of gas flow toward the perimeter of the nozzle array. The shift has two effects: (1) moving the center of the deposit, and (2) broadening the deposition. The three element deposition profile shows a well-defined peak shape with a width of 150 μm (FIG. 14D). The simple nozzle profile (FIG. 10B) shows irregularly shaped peaks with broad deposition. The deposition from the two inner nozzles merges with the distribution from the outer nozzles. Pixels in a display may be spaced at regular intervals and organic material for that pixel must be deposited so that no material from the pixel impinges on neighboring pixels. When the flux from a nozzle is shifted due to a neighboring nozzle, the tail of the Gaussian deposition distribution may move into a neighboring pixel. If material does deposit on neighboring pixels the color, efficiency and lifetime may be adversely affected. Within each pixel, the deposited organic material must have uniform thickness and composition profiles. If the flux from a nozzle is altered, the thickness profile will become less uniform, and the quality of light emitted from each pixel will not be equivalent.

Figure 15:
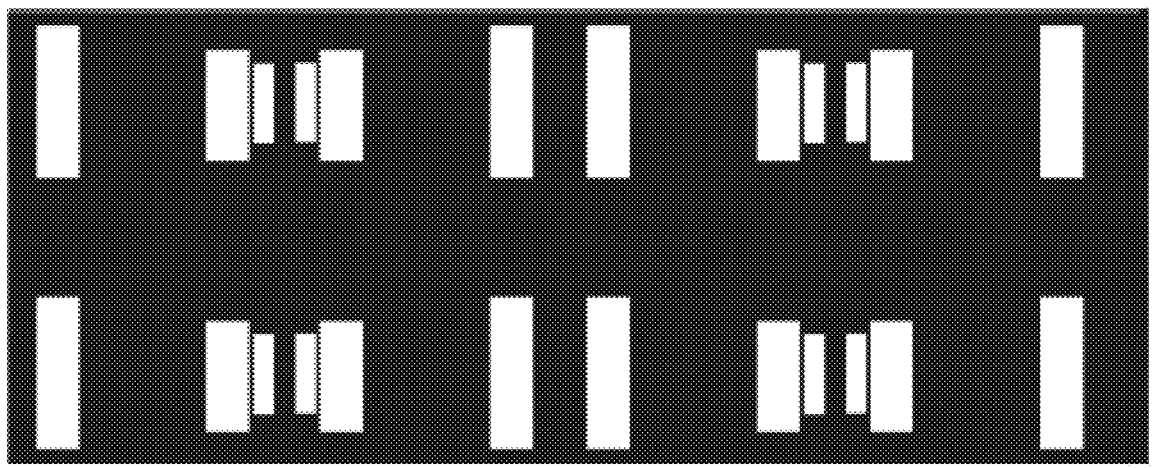
FIG. 15 shows a two dimensional array with deposition apertures aligned so that a deposition from the apertures in successive rows adds to the deposition from the first row according to an embodiment of the disclosed subject matter.
Figure 15:
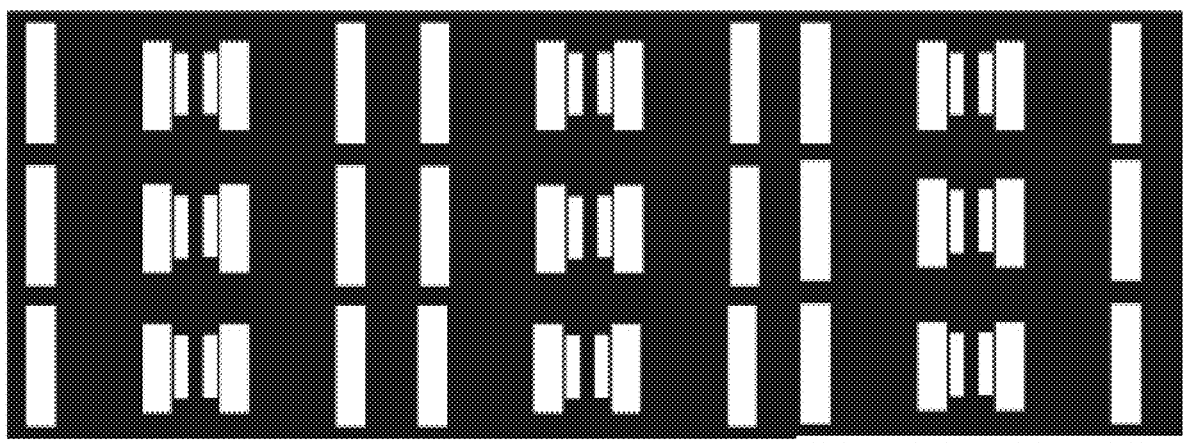
Figure 16:
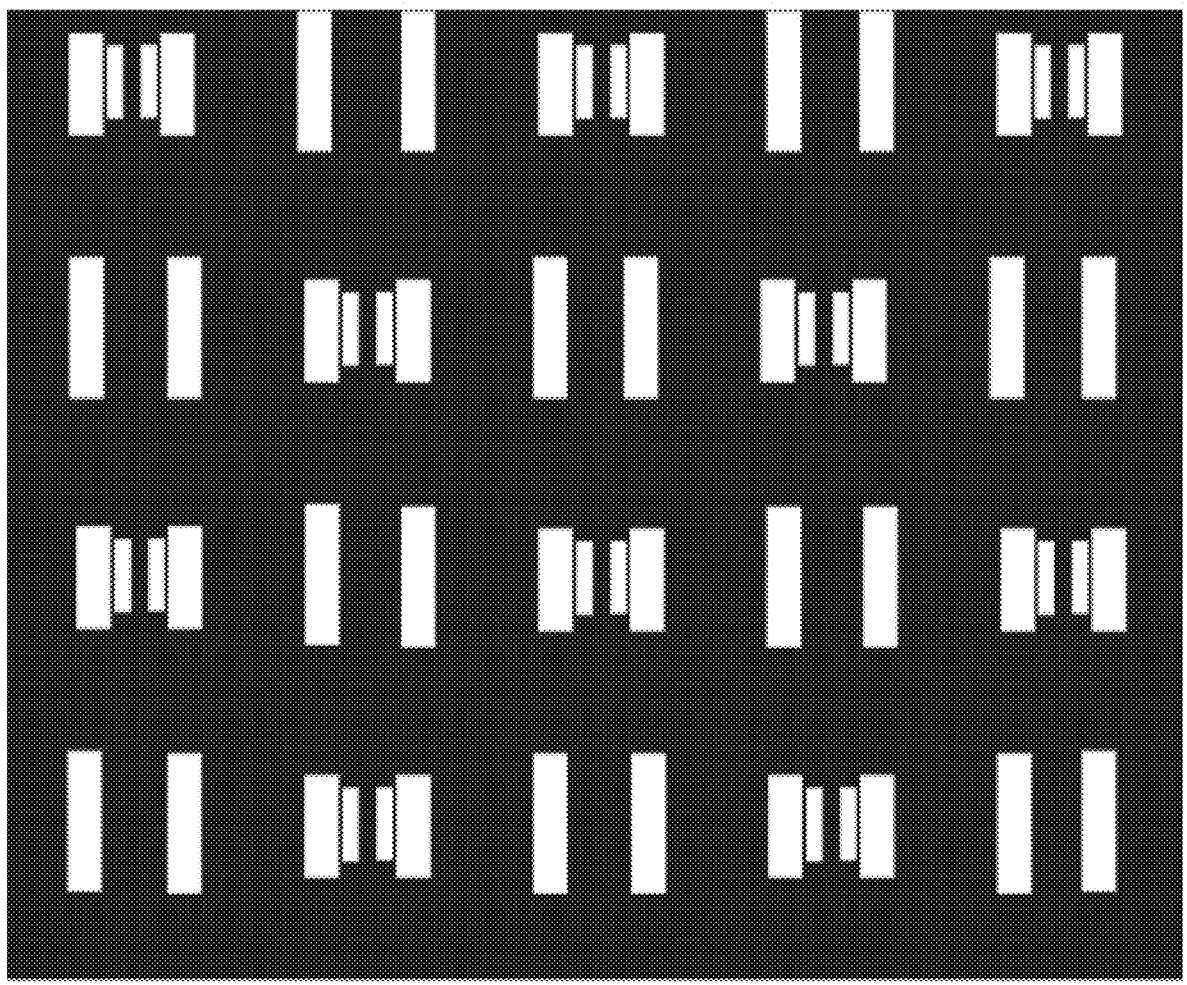
FIG. 16 shows a two dimensional array with both aligned and staggered deposition nozzles according to an embodiment of the disclosed subject matter.

In addition to linear arrays on nozzles, two-dimensional arrays may be made as shown in FIG. 15 and FIG. 16. FIG. 15 shows a two-dimensional array with deposition apertures aligned so that deposition from apertures in successive rows would add the deposition from the first row. FIG. 16 shows a two-dimensional array having both aligned deposition nozzles and staggered deposition nozzles. This configuration may print lines with half the spacing of the array in FIG. 15 because of the staggered nozzles and would double print each line by having two aligned nozzles, as in FIG. 15.

In view of the above, embodiments of the disclosed subject matter may include a device having a nozzle, a source of material to be deposited on a substrate in fluid communication with the nozzle, a delivery gas source in fluid communication with the source of material to be deposited with the nozzle, an exhaust channel disposed adjacent to the nozzle, and a confinement gas source in fluid communication with the nozzle and the exhaust channel, and disposed adjacent to the exhaust channel.

A deposition device or system as disclosed herein may include a connector configured to connect to an external vacuum source. The connector places an exhaust aperture, coupled to the exhaust channel, in fluid communication with the external vacuum source when connected to the external vacuum source.

The exhaust channel of the device can be angled away from a delivery gas aperture, where the delivery gas aperture is in fluid communication with the delivery gas source.

A confinement gas from the confinement gas source can be provided at a temperature lower than a delivery gas temperature. The confinement gas may be provided by the confinement gas source at the same temperature as a delivery gas through additional apertures of the nozzle. Alternatively, the confinement gas from the confinement gas source may be provided at a temperature greater than a delivery gas temperature.

The nozzle of the device may include a plurality of apertures. The nozzle can include a delivery channel separator disposed within a delivery channel opening, where the delivery channel separator divides the delivery opening into two or more distinct apertures, and wherein the delivery channel opening is in fluid communication with the delivery gas source.

The device can include a nozzle block having a delivery aperture and an exhaust aperture, where the delivery aperture is in fluid communication with the delivery gas source and the exhaust aperture is in fluid communication with the exhaust channel. One or more exhaust apertures may at least partially surrounds the delivery aperture within the nozzle block. The delivery aperture may be defined by an edge of the nozzle block and a channel in the nozzle block. The exhaust aperture may at least partially surround the channel in the nozzle block.

The nozzle block may include one or more confinement gas apertures in fluid communication with the confinement gas source. The nozzle block may include a chiller plate disposed adjacent to the nozzle. The nozzle block may include a plurality of nozzles. In some embodiments, the plurality of nozzles may be disposed in a linear arrangement within the nozzle block. Alternatively, the plurality of nozzles may be disposed in a staggered arrangement within the nozzle block.

A confinement gas from the confinement gas source may have at least the same average molar mass as a delivery gas from the delivery gas source. Alternatively, the confinement gas from the confinement gas source has a higher average molar mass than a delivery gas from the delivery gas source. The confinement gas source may be in fluid communication with an external confinement gas source that is external to the device.

The device may include a substrate holder disposed below the nozzle, for example, as shown in FIG. 11. The substrate holder permits loading and unloading of the substrate and moves the substrate relative to the nozzle assembly during printing. The substrate holder may be disposed a distance from the nozzle sufficient to position a substrate 10-1000 μm from the nozzle. Devices according to embodiments of the invention may include a rastering mechanism such as a belt or other conveyor system, which allows the nozzle assembly and the substrate or substrate holder to be moved laterally relative to one another. The substrate holder may be temperature controlled to remove heat transferred to the substrate during printing and maintain the substrate at an optimum temperature for printing organic material. Temperature control may be accomplished with a cooling loop inside of the substrate holder that permits heat exchange fluid to flow in a closed circuit between the substrate holder and a heat sink external to the process chamber. Temperature control may also be achieved with a thermoelectric device, and/or with helium backside cooling.

Embodiments of the disclosed subject matter may also provide a method including ejecting a delivery gas and a material to be deposited on a substrate from a nozzle, providing a confinement gas having a flow direction opposing a flow direction of the delivery gas ejected from the nozzle; and providing a vacuum source adjacent to a delivery gas aperture of the nozzle.

The method may include providing the confinement gas at a temperature lower than the ambient temperature below the nozzle.

The method may include providing the confinement gas at the same temperature as a delivery gas through additional apertures of the nozzle. Alternatively, the method may provide the confinement gas at a temperature greater than a delivery gas temperature. The confinement gas may be provided from an ambient chamber.

The confinement gas may be provided from one or more nozzles in fluid communication with a confinement gas source external to a process chamber in which the nozzle is disposed. The confinement gas may be provided through a pair of apertures of the nozzle. The method may include chilling the confinement gas.

The method may include rastering the nozzle over a substrate disposed adjacent to the nozzle to form a continuous film above the substrate.

The method may include providing a plurality of delivery gases and a plurality of materials to be deposited on the substrate via the nozzle, wherein the nozzle has one or more apertures.

Embodiments of the disclosed subject matter may provide a nozzle assembly having a plurality of nozzles, with each nozzle comprising at least three separate types of flow channels which include a delivery channel to provide a delivery gas including an organic material, exhaust channels arranged adjacent to the delivery channel to evacuate gas from an area disposed between the nozzle assembly and a substrate, and confinement gas channels arranged adjacent to the exhaust channels to supply a confinement gas flow.

The nozzles of the nozzle array may be arranged to form a linear array. Alternatively, the nozzles of the nozzle assembly may be arranged to form a two dimensional array.

A sum of gas flows from the delivery channel and the confinement gas channels may be equal to a gas flow from the exhaust channels. A gas flow from the exhaust channels is greater than a sum of gas flows from the delivery channel and the confinement gas channels of the nozzle assembly. Alternatively, a gas flow from the exhaust channels may be less than a sum of gas flows from the delivery channel and the confinement gas channels of the nozzle assembly.

The nozzle assembly may include a nozzle block having a plurality of nozzles arranged in a linear or two dimensional (2D) array, and gas channels disposed on a bottom surface of the nozzle block.

Figure 17:
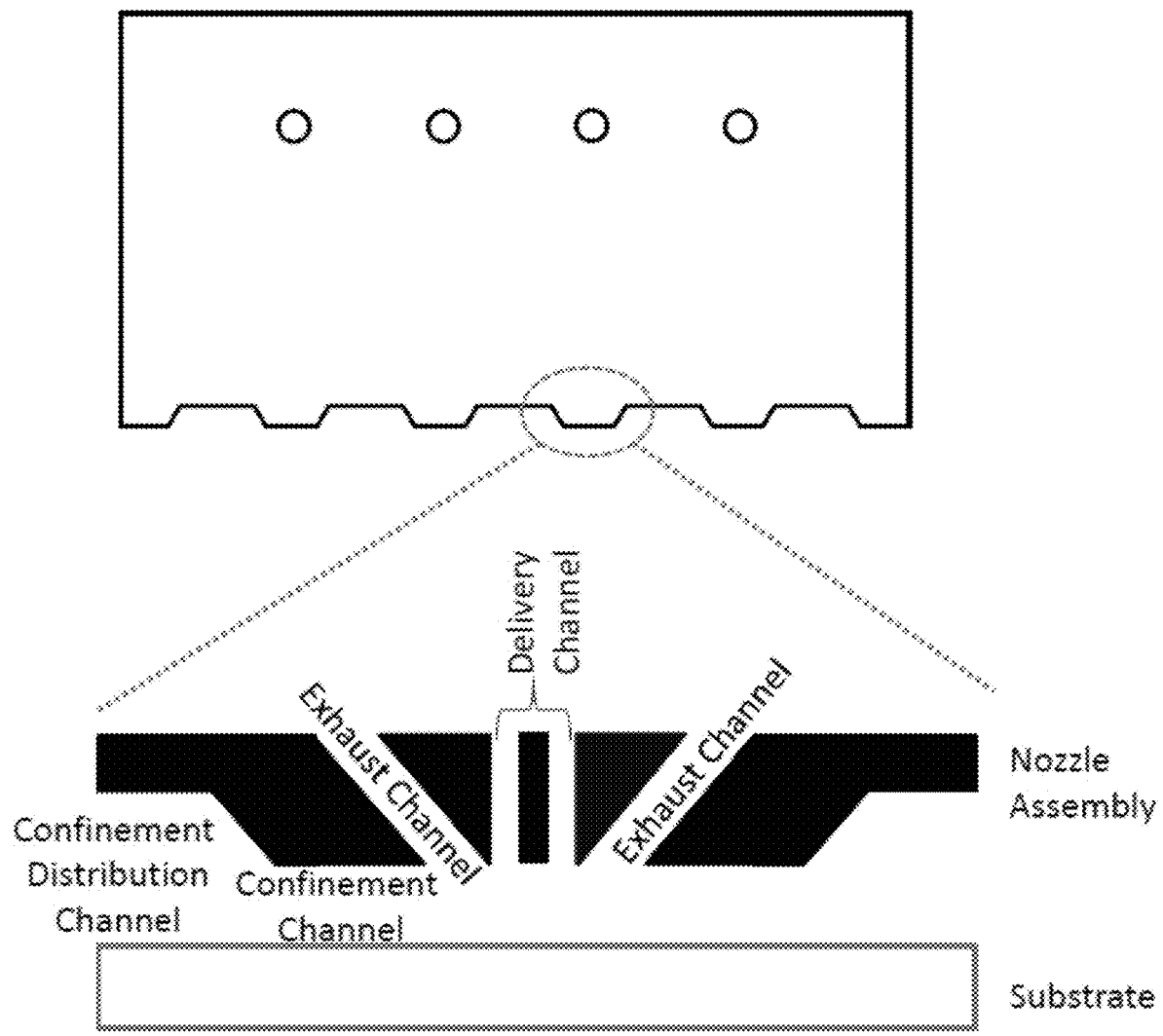
FIG. 17 shows a nozzle assembly that includes confinement distribution channels according to an embodiment of the disclosed subject matter.

As shown in FIG. 17, the nozzle block of the nozzle assembly may include confinement distribution channels that provide a low impedance path for the flow of confinement gas from a process chamber ambient or a separate gas supply to the confinement channels of each nozzle assembly. In this case, the confinement distribution channel may be the region between the nozzle assembly and the substrate adjacent to the deposition zone underneath the delivery and exhaust apertures. The confinement distribution channel may place the chamber ambient in fluid communication with each nozzle assembly. Confinement distribution channels may be integrated within the nozzle block or they may be recesses in a surface of the nozzle block adjacent to the substrate. The widened gas flow paths formed between the recesses in the die surface and the substrate form the confinement distribution channels. In an embodiment of the disclosed subject matter, the confinement distribution channels may be formed from recesses in the substrate-adjacent edge of the nozzle block that have a constant cross-section in a plane parallel to a plane of the nozzle block. The confinement distribution channels may be arranged so that one is adjacent to each side of each nozzle.

The delivery gas may have lower molecular weight than the confinement gas. In some embodiments, the delivery gas and confinement gas may be the same gas. The molecular weight of the delivery gas may be greater than the molecular weight of the confinement gas.

In some embodiments of the disclosed subject matter, a deposition pattern from each nozzle of the nozzle assembly may be equivalent to one another.

Embodiments of the disclosed subject matter may provide forming a nozzle assembly having a plurality of nozzles, with each nozzle comprising at least three separate types of flow channels, including forming a first channel to provide a delivery gas including an organic material, forming a plurality of second channels arranged adjacent to the first channel to evacuate gas from an area disposed between the nozzle assembly and a substrate, and forming a plurality of confinement gas channels arranged adjacent to the plurality of second channels to supply a confinement gas flow.

Embodiments of the disclosed subject matter may also provide a deposition system having a nozzle assembly having a plurality of nozzles, with each nozzle comprising at least three separate types of flow channels which include a first channel to provide a delivery gas including an organic material, a plurality of second channels arranged adjacent to the first channel to evacuate gas from an area disposed between the nozzle assembly and a substrate, and a pair of confinement gas channels arranged adjacent to the plurality of second channels to supply a confinement gas flow.

Embodiments of the disclosed subject matter may further provide a display fabricated using a nozzle assembly to deposit organic materials, the nozzle assembly having a plurality of nozzles, with each nozzle comprising a plurality of separate types of flow channels which include a first channel to provide a delivery gas including an organic material, a plurality of second channels arranged adjacent to the first channel to evacuate gas from an area disposed between the nozzle assembly and a substrate, and a plurality of confinement gas channels arranged adjacent to the plurality of second channels to supply a confinement gas flow.

EXPERIMENTAL

The gas curtain parameter space was studied using both two dimensional DSMC and computational fluid dynamics (CFD) techniques. The structure was treated in cross-section as shown in FIG. 4, with its in-plane extents being treated as infinite. The importance of edge effects was estimated by simulating the same structure using three dimensional CFD. This was used to generate a map of organic flux onto the plane of the substrate shown in FIG. 18. Regions of high organic flux 801 correlate with the expected size and shape of the printed spot size underneath the nozzle assembly. The intensity of organic flux is given by grayscale 802. The simulation predicted well-controlled edge effects that are not expected to degrade overall printing performance.

A set of dies containing gas curtain depositors was fabricated from a pair of Si wafers using deep reactive ion etching (DRIE) to form straight sidewalled trenches. Mirror image structures on the etched faces of the wafers were aligned to each other and the wafers pair was bonded using Au—Ge solder. This process formed channels within the die. Vertical sidewalls of the trenches became the sides of the channels. The relief between the polished surface of one Si wafer and the bottom of an etched trench on the other wafer defined the depth of some channels.

Deeper channels were formed by matching etched trenches so that the channel depth was the sum of the etch depth. Vias to address the upstream ends of the channels were etched through the outside surface of the bonded wafer pair with DRIE. The organic vapor and delivery gas channels were addressed through vias on one side of the wafer, while the exhaust channels were addressed through vias on the other side. Dies were singulated from the wafer pair using either DRIE or stealth dicing to make very (<10 µm) precisely positioned cuts with minimal kerf. The apertures of both the nozzles (e.g., delivery channels) and exhaust channels were defined by the intersection of internal channels within the die and its lower edge formed by the dicing process. The structure includes a set of five nozzles, each of which contains a central organic supply channel flanked by exhaust channels to remove recoiled organic material.

Figure 19:
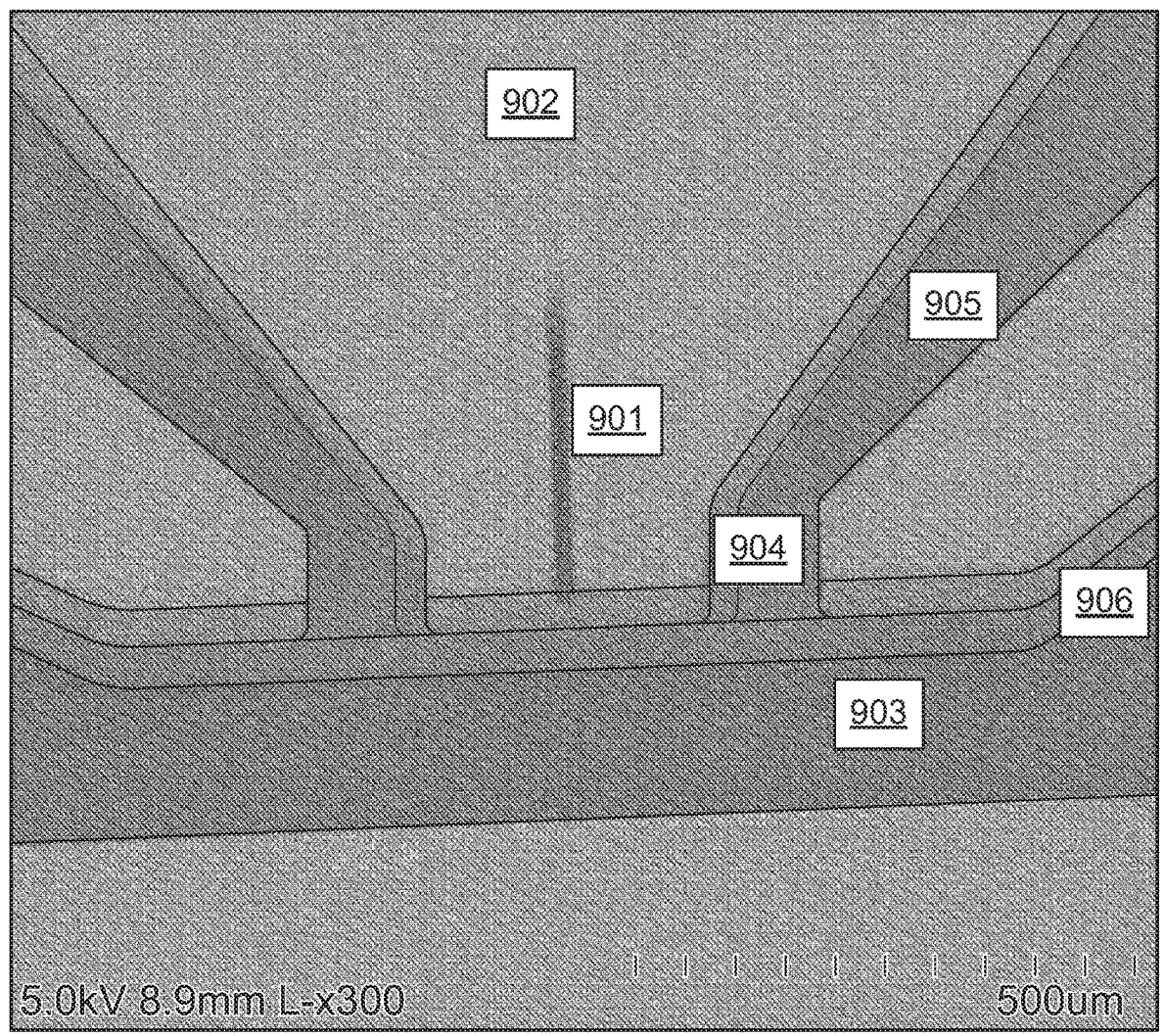
FIG. 19 shows a scanning electron micrograph of the interior channels of a nozzle assembly etched from a silicon (Si) wafer according to an embodiment of the disclosed subject matter.

FIG. 19 shows a scanning electron micrograph of the features etched into one side of the wafer pair, which illustrates the internal structure of an example die according to an embodiment of the disclosed subject matter. The delivery channel 901 runs from a widened feed channel 902 to a breakout line 903 at the base of the die defining its underside. Exhaust apertures 904 on either side of the nozzle may allow surplus organic vapor and delivery gas to escape through exhaust channels 905 to low pressure regions outside of the chamber. Recesses etched into the underside of the die 906 may serve as confinement distribution channels that facilitate the flow of confinement gas from the chamber ambient to the underside of the nozzle assembly and thus improve the uniformity of the resulting gas curtain. The structure shown in FIG. 19 was aligned and bonded to a second Si wafer containing mirror images of structures 904 and 905. This resulted in a sealed structure in which the nozzle was effectively surrounded by exhaust apertures.

Figure 20A:
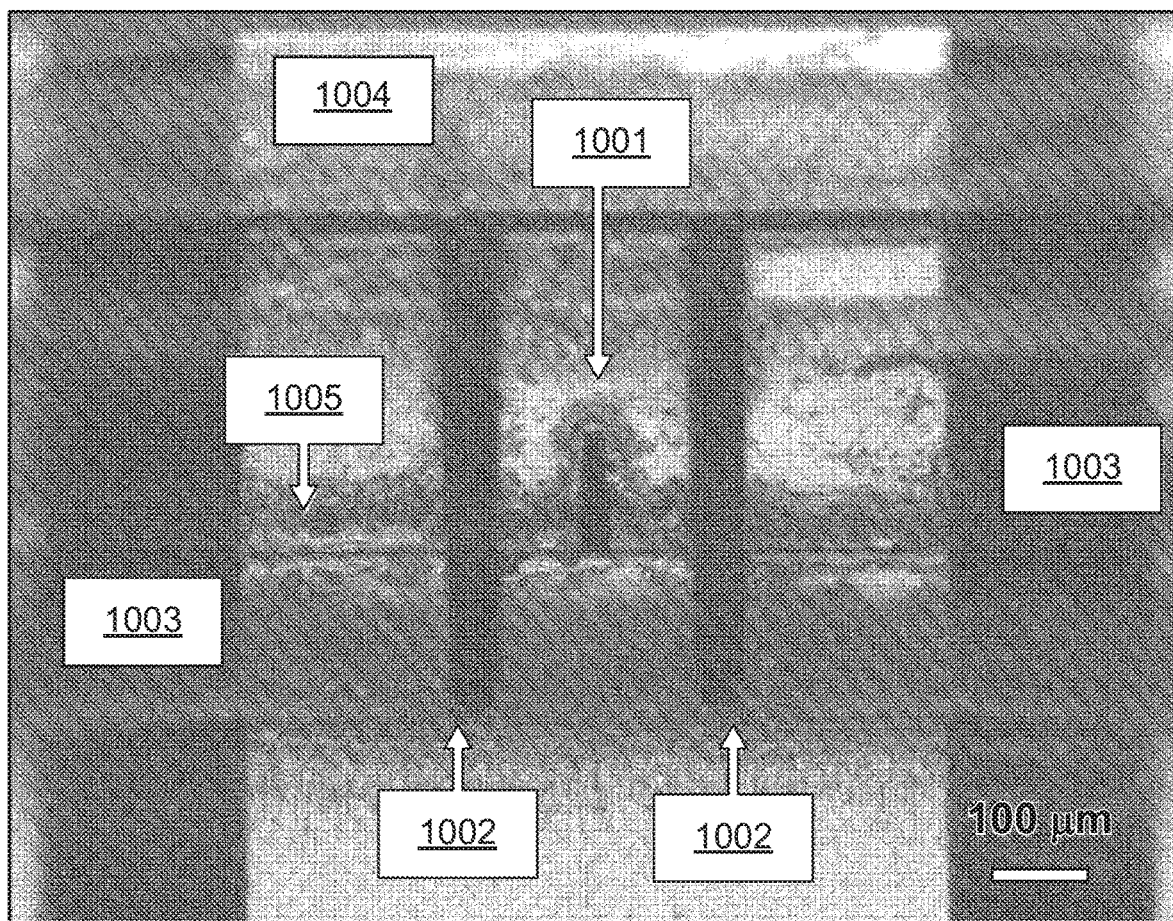
FIG. 20A shows a micrograph of the substrate-facing edge of a Si die according to an embodiment of the disclosed subject matter, including the nozzle, exhaust apertures, and other features.

The features of a nozzle assembly are visible from the outside when the die is viewed edge on. The bottom edge of the die, which faces the substrate during operation, is shown in FIG. 20A. Organic vapor is ejected onto the substrate through a delivery aperture 1001. The nozzle assembly moves relative to the substrate in a direction parallel to the long axis of the delivery aperture. The delivery aperture is surrounded on both of its long sides by apertures of exhaust channels 1002. The exhaust apertures of the exhaust channels collect excess organic vapor to prevent it from condensing onto the substrate outside of the intended deposition zone. The long axes of the exhaust apertures of the exhaust channels extend beyond those of the delivery aperture to prevent spreading of organic vapor due to edge effects near the ends of the central nozzle.

Confinement gas enters along the edges of the bottom face of the nozzle assembly. The flow of the confinement gas from the chamber ambient is facilitated through confinement distribution channels cut into the underside of the nozzle assembly 1003. These channels are on both sides of the nozzle assembly and run parallel to the long axis of the nozzle aperture (e.g., the aperture of the delivery channel). They may create a uniform flow of confinement gas from their inner edges to the exhaust channel, creating a gas curtain to prevent the migration of organic vapor outside of the intended deposition zone. Confinement gas can also enter along the die edges parallel to the short axis of the nozzle aperture 1004. The channels within the die that connect to the delivery and exhaust apertures are fabricated by mating etched surfaces of two Si wafers with features such as those shown in FIG. 19. The wafers, and the singulated dies resulting from them are bonded together with Au—Ge eutectic solder, such as described in U.S. Patent Publication 2014/0116331, the disclosure of which is incorporated by reference in its entirety. The solder joint 1005 runs horizontally through the midsection of the die.

A simulation was performed to identify a set of favorable process conditions in advance of upcoming experiments. A pressure of 100 Torr at a confinement gas inlet, such as inlet 403 in FIG. 4, is expected to be near optimal. The increase in diffusion coefficient and organic molecule mean free path below 10 Torr limits the effectiveness of the gas curtain. Conversely, operating at pressures significantly higher than 300 Torr tends to restrict diffusive transport of organic vapor to the substrate. The nozzle assembly is heated to prevent condensation of organic vapor. It operates at approximately 300° C., as does the evaporation and mixing hardware upstream of it. The base of the nozzle assembly is held 50 µm over the substrate.

Confinement gas can be either fed into the deposition zone through dedicated nozzles or drawn from the chamber ambient, as in the in the initial experiments. Since the organic vapor jet delivery gas and confinement gas need not come from the same source, dissimilar gases may be used. A light delivery gas such as helium can be used to increase the rate of diffusion of organic vapor underneath the nozzle. A heavier gas such as argon or sulfur hexafluoride can suppress both organic vapor diffusion and heat transfer to the substrate in the confinement gas. Using a light delivery gas and heavy confinement gas, broadens the range of suitable ambient operating pressures, possibly up to atmospheric pressure. The capability to perform OVJP at atmospheric pressure has been previous demonstrated, but at substantially coarser resolution.

Interaction between molecules of organic vapor and the delivery gas was modeled using the Direct Simulation Monte Carlo method of Bird. The delivery gas flow field was computed first. Tracers representing organic vapor were then introduced into this flow field. Their trajectories are determined by interactions with delivery gas molecules. A helium delivery gas was modeled as hard spheres having a diameter of $2.8 \times 10^{-10}$ m and a mass of 0.004 kg/mol. Organic molecules were modeled as having a diameter of $1 \times 10^{-9}$ m and a mass of 0.5 kg/mol, typical of OLED materials.

This method is most widely used for flows in which Kn is greater than 0.1, in which molecules have large mean free paths relative to their containers. While this was not true of most operating conditions under study, an atomistic treatment was required to determine the effect of sticking coefficient on the paths followed by organic vapor molecules. Non-unity sticking can be modeled by treating the sticking coefficient α as an accommodation coefficient commonly used to model the thermal interaction between gas molecules and a boundary. An organic molecule crossing the substrate boundary has a probability of thermalizing with its boundary. Since the substrate is below the molecule's sublimation temperature, a thermalized molecule becomes adsorbed. Conversely, an incident organic molecule has 1−α probability of not thermalizing with the boundary. If so, it remains in the vapor phase and spectacularly reflects from the substrate boundary.

Figure 18:
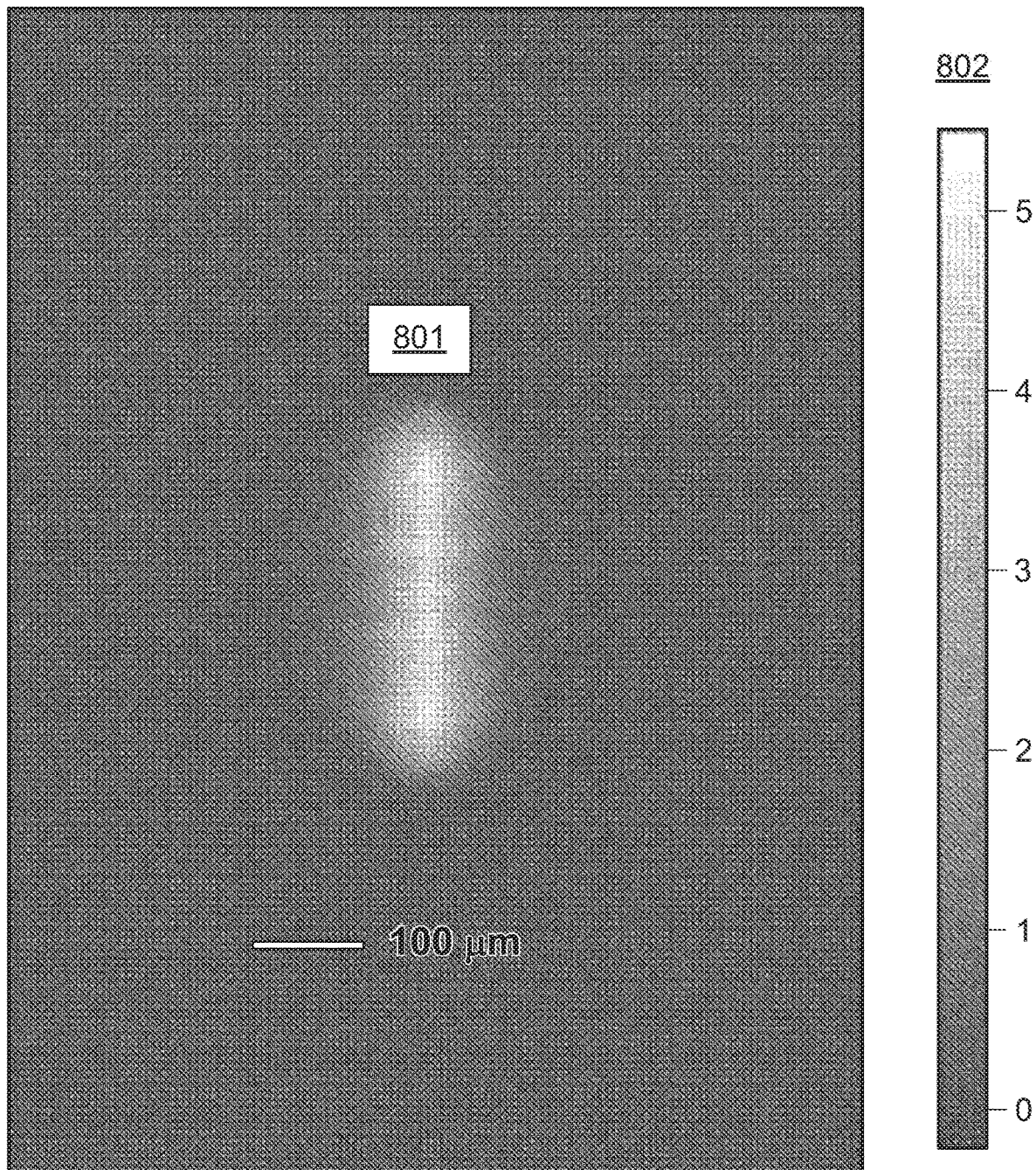
FIG. 18 shows spatially resolved flux of organic material from a nozzle assembly onto a substrate predicted by a computational fluid dynamics model according to an embodiment of the invention.

Once it was established that the thickness distribution of features generated by the nozzle assembly are relatively insensitive to sticking coefficient, computational fluid dynamics software (COMSOL, Burlington, Mass.) was used to model gas flow and the propagation of organic vapor through it. The transport properties of organic vapor in nitrogen gas were calculated from kinetic theory. Two dimensional simulations rendering the nozzle assembly in cross-section were used to study the parameter space of its operation, as shown in FIGS. 5-7. A more computationally intensive three dimensional model was used to confirm the simpler model's results for the most promising cases. FIG. 18 shows the results of one such example simulation.

Figure 20B:
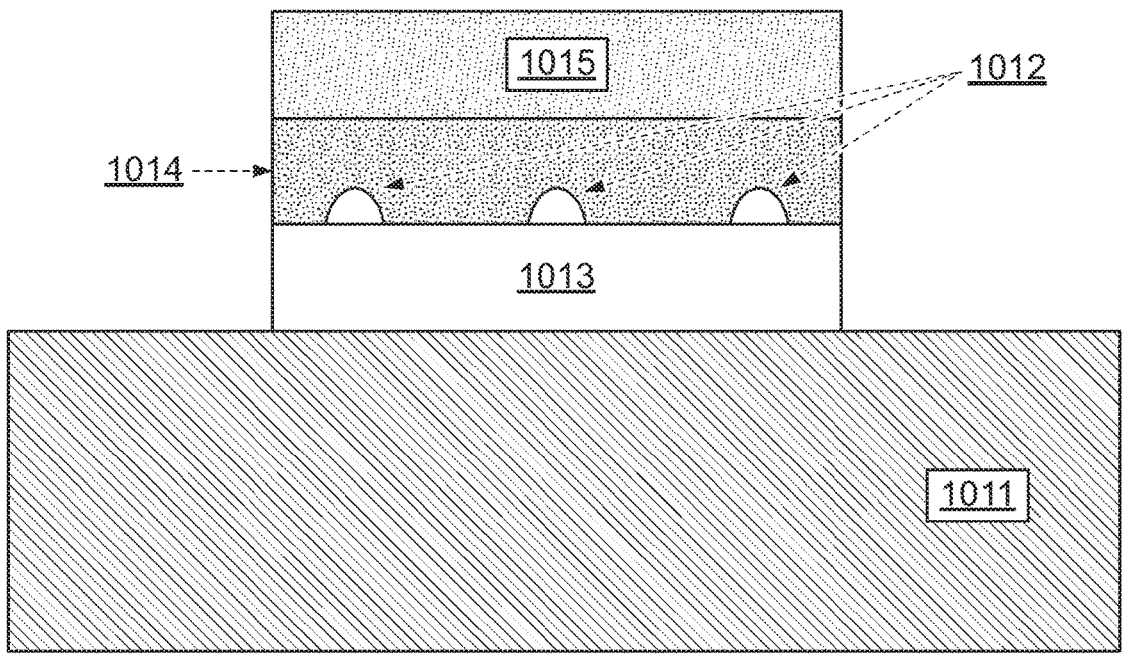
FIG. 20B shows a schematic illustration of an OLED structure fabricated according to an embodiment of the invention.

An embodiment of a deposition system as described herein with respect to FIG. 20A was tested by fabricating a structure as shown in FIG. 20B, by growing an emissive layer 1012 of a phosphorescent OLED. The emissive layer included a green emitting organic electrophosphorescent compound mixed with an organic host deposited with organic vapor jet printing of an embodiment of the disclosed subject matter. The OLED was fabricated on a glass substrate 1011 and included an anode layer, a hole injection layer, and a hole transport layer 1013 deposited underneath the emissive layer by standard methods. An electron transport layer and electron injection layer 1014 were deposited over the emissive layer, as was a cathode 1015. A region containing as little as 0.2 Å of electrophosphorescent material between layers 1013 and 1014 will luminesce brightly when current is applied, making this structure relatively effective for determining the fate of deposited material.

Figure 21A:
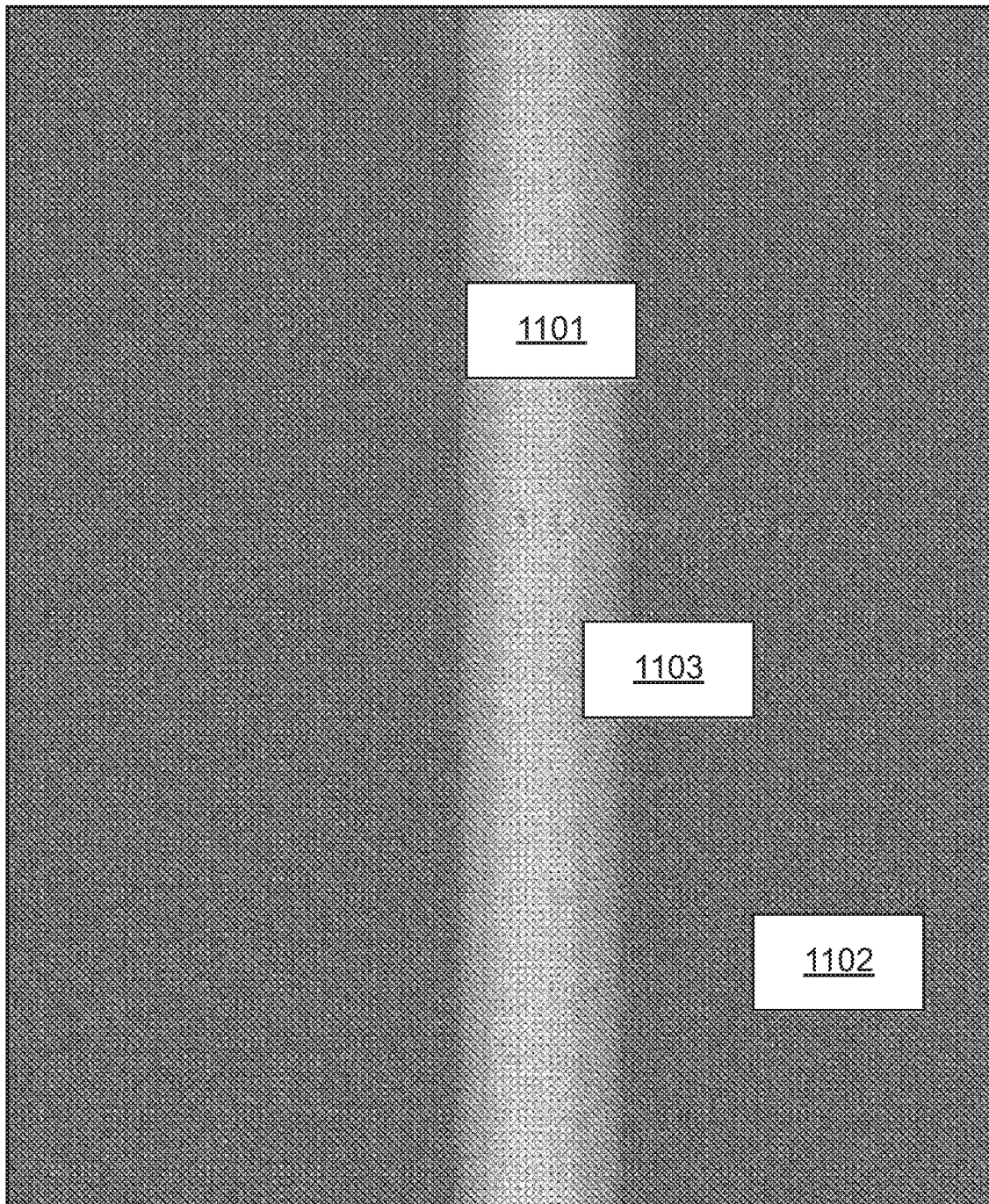
FIG. 21A shows an example of a line of electroluminescent material printed by a technique according to an embodiment of the disclosed subject matter.
Figure 21B:
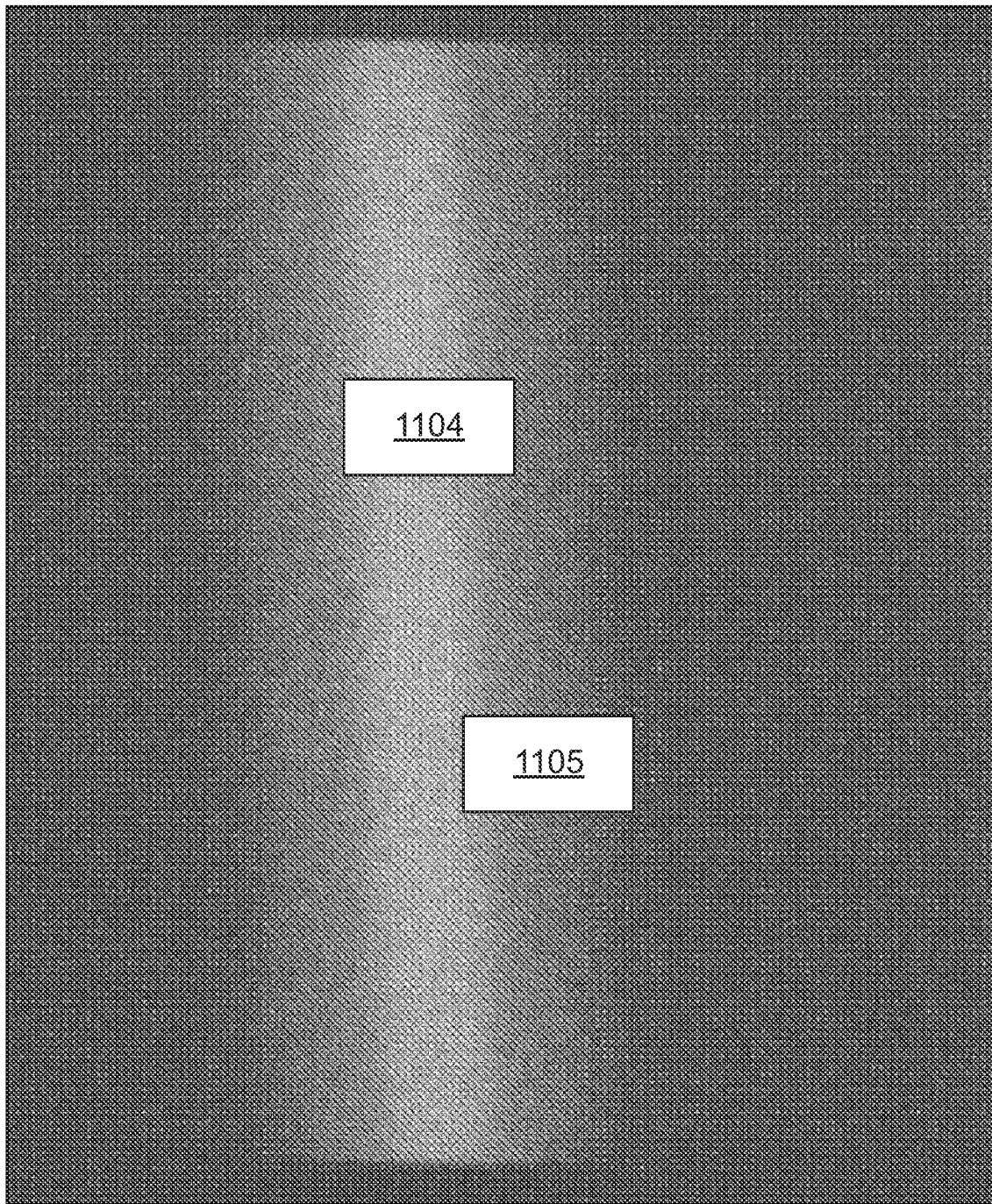
FIG. 21B shows an example of a line of electroluminescent material printed by a conventional technique used previous to the invention.

FIGS. 21A-21B show examples of lines printed by two different organic vapor jet nozzle assemblies. The line in FIG. 21A was printed by an air curtain nozzle assembly according to an embodiment, similar to the structure shown in FIGS. 20A-20B. The chamber ambient was 100 Torr $N_2$. Helium delivery gas laden with organic vapor was fed through each 20 by 150 μm nozzle in the die at 4 sccm, while approximately 10 sccm of gas was withdrawn through each pair of 40 by 450 μm exhaust channels flanking the nozzle (e.g., the delivery channel). The resulting printed feature had a center portion 1101 approximately 195 μm wide that phosphoresced brightly. It was surrounded by a dark field 1102 that showed no sign of contamination by printed material. The transition between these two zones 1103 was 25 μm wide. In contrast, FIG. 21B shows conventional results achieved without a gas curtain. The center of the printed line portion 1104 is 162 μm wide, but it is surrounded on each side by a 130 μm wide luminescent border 1105, indicating the presence of extraneous material. Removal of this extraneous material by the gas curtain results in features that are 46% narrower.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
a substrate holder configured for affixing a substrate thereto, and configured to support the affixed substrate;
a linear array of a plurality of depositors positioned in proximity to the substrate holder such that the linear array of the plurality of depositors are arrayed along a direction orthogonal to a substrate normal, wherein each depositor of the linear array of the plurality of depositors is comprised of at least one elongate delivery aperture that is disposed between exhaust apertures, wherein the exhaust apertures and each at least one elongate delivery aperture between are flush with the planar face of the array,
a source of material to be deposited on the substrate in fluid communication with each at least one elongate delivery aperture of the linear array of the plurality of depositors;
a delivery gas source in fluid communication with each at least the source of material to be permanently deposited onto the affixed substrate with each at least one elongate delivery aperture;
a first confinement gas source in fluid communication with and disposed adjacent to a first exhaust aperture of a first depositor in the linear array of the plurality of depositors,
a neighboring confinement gas source disposed between the first depositor and a neighboring depositor of the linear array of the plurality of depositors,
the neighboring gas confinement source disposed adjacent to the first depositor and in fluid communication with and disposed adjacent to a second exhaust aperture of the first depositor, and disposed adjacent to the neighboring depositor,
the neighboring confinement gas source in fluid communication with a first exhaust aperture of the neighboring depositor, and disposed adjacent to the first exhaust aperture of the neighboring depositor, and
a rastering mechanism configured to control the movement of the substrate holder relative to the linear array of the plurality of depositors in a deposition direction of the linear array of the plurality of depositors, wherein the deposition direction of the linear array of the plurality of depositors is parallel to the longitudinal axis along the elongate dimension of each at least one elongate delivery aperture, and wherein the linear array of the plurality of depositors forms a plurality of lines of deposition on the substrate that are parallel to one another and that are spaced apart from one another,
wherein the exhaust apertures of the plurality of depositors are in fluid communication with an external vacuum source that operates at a lower pressure than a pressure of a chamber where the material is to be deposited on the substrate,
wherein each exhaust aperture of the plurality of depositors is disposed between the at least one elongate delivery aperture and the adjacent confinement gas source neighboring the depositor of the plurality of depositors such that gas emanating from the at least one elongate delivery aperture that does not condense onto

25 the affixed substrate is withdrawn by the adjacent exhaust apertures along with an excess of confinement gas, and that a flow through each adjacent exhaust aperture exceeds a flow from the at least one elongate delivery aperture disposed between the adjacent exhaust apertures, wherein the exhaust apertures of each depositor of the plurality of depositors are arranged so that a distance between the adjacent exhaust apertures is perpendicular to the longitudinal axis along the elongate dimension of each at least one elongate delivery aperture disposed between the adjacent exhaust apertures, wherein the distance between the exhaust apertures of each depositor of the plurality of depositors is a size of a feature being deposited on the substrate, wherein a fly height is less than the distance between the adjacent exhaust apertures of each depositor of the plurality of depositors, wherein the fly height is a distance between each depositor of the plurality of depositors and the substrate where the confinement gas is disposed, and wherein apertures for neighboring confinement gas sources, the adjacent exhaust apertures, and each at least one elongate delivery apertures between the adjacent exhaust apertures are arranged to confine the deposition of the material on one or more predetermined portions of the affixed substrate so that an area between each of the of lines of deposition on the substrate remains free of deposit.

2. The device of claim 1, further comprising a connector configured to connect to an external vacuum source.

3. The device of claim 2, wherein the connector places the exhaust aperture in fluid communication with the external vacuum source when connected to the external vacuum source.

4. The device of claim 1, wherein each delivery aperture is in fluid communication with the delivery gas source.

5. The device of claim 1, wherein the delivery aperture comprises a plurality of sub-apertures.

6. The device of claim 5, wherein a delivery channel comprises a delivery channel separator disposed within the deliver aperture, wherein the delivery channel separator divides the delivery aperture into two or more sub-apertures, and wherein the delivery aperture is in fluid communication with the delivery gas source.

7. The device of claim 1, further comprising a nozzle block, wherein the linear array of the plurality of depositors is contained within a monolithic nozzle block.

8. The device of claim 7, wherein each delivery aperture within the nozzle block is at least partially surrounded by one or more exhaust apertures.

9. The device of claim 7, wherein each delivery aperture is defined by an edge of the nozzle block and a channel in the nozzle block.

10. The device of claim 9, wherein the exhaust aperture at least partially surrounds the delivery aperture in the nozzle block.

11. The device of claim 7, wherein the nozzle block comprises confinement gas apertures in fluid communication with the confinement gas source.

12. The device of claim 7, wherein the nozzle block further comprises a chiller plate disposed adjacent to the nozzle block.

13. The device of claim 7, wherein the nozzle block includes a staggered arrangement of two or more linear arrays of depositors.

14. The device of claim 7, wherein each exhaust aperture is defined by an edge of the nozzle block and a channel in the nozzle block.

15. The device of claim 13, wherein each delivery aperture and each exhaust aperture is between 50 and 5000 µm in width.

16. The device of claim 1, wherein the confinement gas source is in fluid communication with an external confinement gas source that is external to the device.

17. The device of claim 1, further comprising a temperature controller to control the operating temperature of the substrate holder.

18. The device of claim 1, wherein each delivery aperture and each exhaust aperture is rectangular and between 5 and 100 µm in width.

19. The device of claim 18, wherein an adjacent edge-to-edge separation of each delivery aperture and exhaust aperture is between 5 and 100 µm.

20. The device of claim 1, wherein a fly height is distance between the depositors and the substrate where the confinement gas is disposed.

21. The device of claim 1, wherein the spacing between delivery apertures of the linear array is 500 microns.

22. The device of claim 1, wherein the width of each delivery aperture of the linear array is 30 microns.

23. The device of claim 1, wherein a distance between the delivery aperture and the exhaust aperture is the same in at least two directions relative to the linear array of the plurality of depositors.

24. The device of claim 1, wherein the vapor pressure of the delivery gas at the nozzle is between 10-760 Torr.

25. A depositor array comprising:
a substrate holder configured for affixing a substrate thereto, and configured to support the affixed substrate;
a plurality of depositors, positioned in proximity to the substrate holder, that are arranged linearly in an array oriented orthogonally to a substrate normal, with each depositor comprising at least three separate types of flow channels which include:
a delivery channel to provide a delivery gas including an organic material that permanently condenses onto the affixed substrate;
exhaust channels arranged adjacent to the delivery channel to evacuate gas from an area disposed between a nozzle assembly and the substrate, and to remove at least a portion of surplus organic material; and
confinement gas channels arranged adjacent to and operable concurrently with both the exhaust channels and the delivery channel to supply a confinement gas flow,
wherein a flow through each of the exhaust channels exceeds a flow from the delivery channel,
a rastering mechanism configured to control the movement of the substrate holder relative to the plurality of depositors in a deposition direction of the plurality of depositors, wherein the deposition direction of the plurality of depositors is parallel to a longitudinal axis along an elongate dimension of each delivery channel, and wherein the plurality of depositors form a plurality of lines of deposition on the substrate that are parallel to one another and that are spaced apart from one another,
wherein the exhaust channels are in fluid communication with an external vacuum source that operates at a lower pressure than a pressure of a chamber where the organic material is to be deposited on the substrate, wherein the exhaust channels are arranged so that a distance between the exhaust channels is perpendicular to an edge of a deposition direction, where the distance between the exhaust channels is a size of a feature being deposited on the substrate, wherein a fly height is less than the distance between the exhaust channels, wherein the fly height is a distance between the delivery channel and the substrate where the confinement gas is disposed, and wherein an aperture for the delivery channel, at least one aperture for the confinement gas channels disposed adjacent to the aperture for the delivery channel, and an exhaust aperture for the exhaust channels that is disposed adjacent to the at least one aperture for the confinement gas channels are arranged to confine the deposition of the organic material on one or more predetermined portions of the affixed substrate so that an area between each of the lines of deposition on the substrate remains free of deposit.

26. A deposition system, comprising:

a substrate holder configured for affixing a substrate thereto, and configured to support the affixed substrate;

a depositor array having a plurality of depositors, positioned in proximity to the substrate holder, that are arranged linearly in an array oriented orthogonally to a substrate normal, with each depositor comprising at least three separate types of flow channels which include:

a first channel to provide a delivery gas including an organic material;

a plurality of second channels arranged adjacent to the first channel to evacuate gas from an area disposed between a nozzle assembly and a substrate, and to remove at least a portion of surplus organic material; and a pair of confinement gas channels arranged adjacent to the plurality of second channels to supply a confinement gas flow and operable concurrently with both the plurality of second channels and the first channel to evacuate gas, a rastering mechanism configured to control the movement of the substrate holder relative to the plurality of depositors in a deposition direction of the plurality of depositors, wherein the deposition direction of the plurality of depositors is parallel to a longitudinal axis along an elongate dimension of the first channel, and wherein the plurality of depositors form a plurality of lines of deposition on the substrate that are parallel to one another and that are spaced apart from one another, wherein the plurality of second channels are in fluid communication with an external vacuum source that operates at a lower pressure than a pressure of a chamber where the organic material is to be deposited on the substrate, wherein a flow through each of the second channels exceeds a flow from the first channel, wherein the second channels are arranged so that a distance between the second channels is perpendicular to an edge of a deposition direction, where the distance between the second channels is a size of a feature being deposited on the substrate, wherein a fly height is less than the distance between the second channels, wherein the fly height is a distance between the first channel and the substrate where the confinement gas is disposed, and wherein an aperture for the first channel, at least one aperture for the confinement gas channels disposed adjacent to the aperture for the first channel, and an exhaust aperture for the second channels that is disposed adjacent to the at least one aperture for the confinement gas channels are arranged to confine the deposition of the organic material on one or more predetermined portions of the affixed substrate so that an area between each of the lines of deposition on the substrate remains free of deposit.

* * * * *